US010985235B2

(12) United States Patent
Lee et al.

(10) Patent No.: US 10,985,235 B2
(45) Date of Patent: Apr. 20, 2021

(54) DISPLAY DEVICE

(71) Applicant: Samsung Display Co., Ltd., Yongin-si (KR)

(72) Inventors: Dong Hyun Lee, Yongin-si (KR); Deuk Jong Kim, Yongin-si (KR); Shin Jeong Han, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/751,568

(22) Filed: Jan. 24, 2020

(65) Prior Publication Data

US 2020/0161411 A1     May 21, 2020

Related U.S. Application Data

(62) Division of application No. 15/726,440, filed on Oct. 6, 2017, now Pat. No. 10,580,850.

(30) Foreign Application Priority Data

Dec. 7, 2016   (KR) ........................ 10-2016-0165803

(51) Int. Cl.
*H01L 27/32* (2006.01)
*G09G 3/3233* (2016.01)
(Continued)

(52) U.S. Cl.
CPC ...... *H01L 27/3279* (2013.01); *H01L 27/3258* (2013.01); *G09G 3/3233* (2013.01);
(Continued)

(58) Field of Classification Search
None
See application file for complete search history.

(56) References Cited

U.S. PATENT DOCUMENTS 6,531,815 B1 * 3/2003 Okuyama ........... H01L 27/3276
313/498
2009/0174681 A1   7/2009 Chang et al.
(Continued)

FOREIGN PATENT DOCUMENTS

KR      10-0722103      5/2007
KR   10-2009-0075369   7/2009
(Continued)

*Primary Examiner* — Nicholas J Tobergte
*Assistant Examiner* — Kien C Ly
(74) *Attorney, Agent, or Firm* — Kile Park Reed & Houtteman PLLC

(57) ABSTRACT

A display device includes a substrate, a first insulating layer, a power lines, and connection lines. The substrate includes a peripheral area adjacent to at least one side of a pixels area. The first insulating layer including one or more contact holes. The power line is in the peripheral area and provides a driving voltage to pixels. The power line includes a first metal layer on the substrate and a second metal layer connected to the first metal layer through the contact hole. The connection lines extend to the peripheral area from the pixels and overlap part of the power line. The power line includes a first area in which the first and second metal layers are electrically connected through the contact hole. The connection line does not overlap the first area of the power line.

13 Claims, 13 Drawing Sheets

(51) Int. Cl.
G09G 3/3275 (2016.01)
G09G 3/3266 (2016.01)

(52) U.S. Cl.
CPC ......... *G09G 3/3266* (2013.01); *G09G 3/3275* (2013.01); *G09G 2300/0819* (2013.01); *G09G 2300/0842* (2013.01); *G09G 2300/0861* (2013.01); *G09G 2310/0262* (2013.01); *G09G 2310/08* (2013.01); *G09G 2330/02* (2013.01)

(56) References Cited

U.S. PATENT DOCUMENTS

| | | |
|---|---|---|
| 2011/0157110 A1 | 6/2011 | Chou et al. |
| 2012/0099036 A1 | 4/2012 | Chang |
| 2012/0162053 A1 | 6/2012 | Lee et al. |

FOREIGN PATENT DOCUMENTS

| | | |
|---|---|---|
| KR | 10-2012-0040916 | 4/2012 |
| KR | 10-2017-0115148 | 10/2017 |

\* cited by examiner

DISPLAY DEVICE

CROSS-REFERENCE TO RELATED APPLICATION

This is a divisional application based on currently pending U.S. patent application Ser. No. 15/726,440, filed on Oct. 6, 2017, the disclosure of which is incorporated herein by reference in its entirety. U.S. patent application Ser. No. 15/726,440 claims priority benefit of Korean Patent Application No. 10-2016-0165803, filed on Dec. 7, 2016 in the Korean Intellectual Property Office and entitled, "Display Device," the disclosure of which is incorporated herein by reference in its entirety for all purposes.

BACKGROUND

1. Field

One or more embodiments described herein relate to a display device.

2. Description of the Related Art

An organic light emitting display device includes pixels that emit light to form an image. Each pixel has an organic light emitting layer between two electrodes. Electrons injected from one electrode and holes injected from the other electrode combine in the organic light emitting layer to form excitons. Light is emitted from the pixel when the excitons change state.

SUMMARY

In accordance with one or more embodiments, a display device includes a substrate including a pixel area including a plurality of pixels and a peripheral area adjacent to at least one side of the pixels area; a first insulating layer on the substrate and including one or more contact holes; a power line, in the peripheral area, to provide a driving voltage to the pixels, the power line including a first metal layer on the substrate and a second metal layer connected to the first metal layer through the contact hole; and a plurality of connection lines on the substrate, the connection lines extended to the peripheral area from the pixels and overlapping a part of the power line, wherein the power line includes a first area in which the first and second metal layers are electrically connected through the contact hole and a second area different from the first area and wherein the connection line does not overlap the first area of the power line.

The first insulating layer may correspond to the second area of the power line excludes the contact hole. The first insulating layer may include an inorganic insulating material or an organic insulating material. The first metal layer may be in the second area of the power line and the second metal layer may not be in the second area. The second insulating layer may be on the first insulating layer. The first insulating layer may be an inorganic insulating material including an inorganic material, and the second insulating layer may be an organic insulating material including an organic material. The second insulating layer may include one or more contact holes corresponding to the contact hole of the first insulating layer. In the first area of the power line, the first metal layer and the second metal layer may be connected through the contact hole of the first insulating layer and the contact hole of the second insulating layer. The display device may include a gate insulating layer and an interlayer insulating layer between the substrate and the first insulating layer. The connection lines may include a first connection line between the gate insulating layer and the interlayer insulating layer; and a second connection line between the substrate and the gate insulating layer. The first and second connection lines may be alternately disposed.

In accordance with one or more embodiments, a display device includes a substrate including a pixel area including a plurality of pixels and a peripheral area adjacent to at least one side of the pixel area; a power line, in the peripheral area, to provide a driving voltage to the pixels, the power line including a first metal layer and a second metal layer on the first metal layer; a plurality of connection lines on the substrate, extending to the peripheral area from the pixels, and spaced apart from one another by a predetermined interval; a planarizing layer between the connection lines and the power line and covering steps of the connection lines; and a first insulating layer on the planarizing layer and including one or more contact holes, wherein the first metal layer and the second metal layer of the power line are electrically connected through the contact hole.

The contact hole of the first insulating layer may correspond to an area between the connection lines. The contact hole of the first insulating layer may correspond to upper surfaces of some connection lines among the connection lines. The planarizing layer may be an organic insulating material including an organic material. The first insulating layer may include an inorganic insulating or an organic insulating material.

The display device may include a second insulating layer on the first insulating layer. The first insulating layer may be an inorganic insulating material including an inorganic material, and the second insulating layer may be an organic insulating material including an organic material. The second insulating layer may include one or more contact holes corresponding to the contact hole of the first insulating layer. The first metal layer and the second metal layer of the power line may be connected through the contact hole of the first insulating layer and the contact hole of second insulating layer.

BRIEF DESCRIPTION OF THE DRAWINGS

Features will become apparent to those of skill in the art by describing in detail exemplary embodiments with reference to the attached drawings in which.

DETAILED DESCRIPTION OF THE INVENTION

Figure 1:
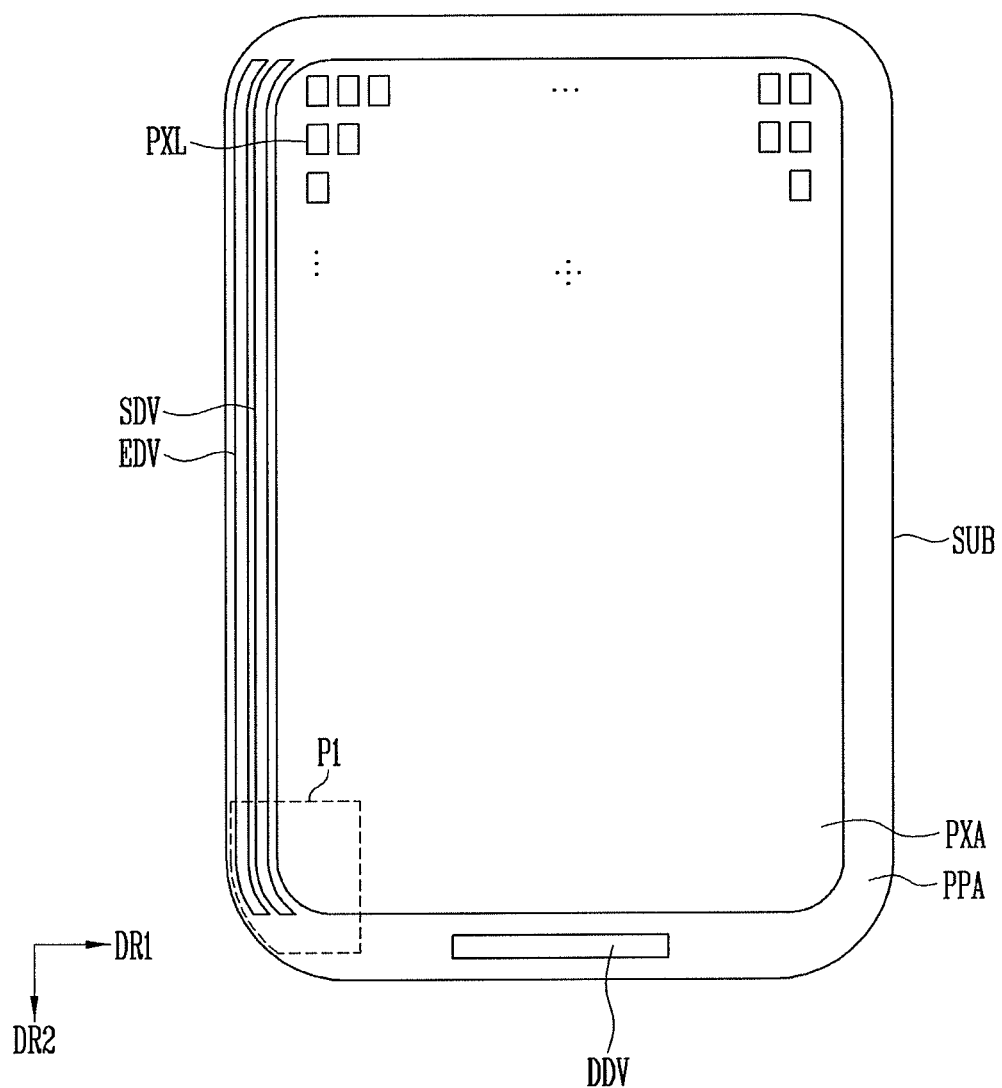
FIG. 1 illustrates an embodiment of a display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of a display device which includes a substrate SUB, pixels PXL on the substrate SUB, a driver on the substrate SUB and driving the pixels PXL, and a wiring unit connecting the pixels PXL and the driver. The substrate SUB may be formed of one region having an approximately rectangular shape. The number of regions in the substrate SUB may be different in another embodiment. Also, the substrate SUB may have a different shape in another embodiment.

The substrate SUB may have a pixel area PXA and a peripheral area PPA. The pixel area PXA may be a display area including the pixels PXL for displaying an image. The peripheral area PPA is an area which does not have the pixels PXL and where an image is not displayed. The driver for driving the pixels PXL and a portion of lines connecting the pixels PXL and the driver may be in the peripheral area PPA. The peripheral area PPA corresponds to a bezel in the final display device. The width of the bezel may be determined, for example, according to the width of peripheral area PPA.

The pixel area PXA may have a shape corresponding to the shape of the substrate SUB. The peripheral area PPA may be provided at at least one side of the pixel area PXA. The pixels PXL are in the pixel area PXA of the substrate SUB. Each pixel PXL may be considered to be a minimum unit that displays light for displaying an image. The pixel PXL may include an organic light emitting diode for emitting white light and/or color light. The color light may be one of a combination colors (e.g., red, green, blue, white, or cyan, magenta, and yellow).

The pixels PXL may be arranged in a matrix form along rows extending in a first direction DR1 and columns extending in a second direction DR2. The pixels PXL may be arranged in a different form in another embodiment.

The driver provides signals to the pixels PXL through a wiring unit to control driving of the pixels PXL. The driver may include a scan driver SDV that provides a scan signal to the pixels PXL through respective scan lines, an emission driver EDV that provides an emission control signal to the pixels PXL through respective emission control lines, a data driver DDV that provides data signals to the pixels PXL through respective data lines, and a timing controller. The timing controller controls the scan driver SDV, the emission driver EDV, and the data driver DDV.

Figure 2:
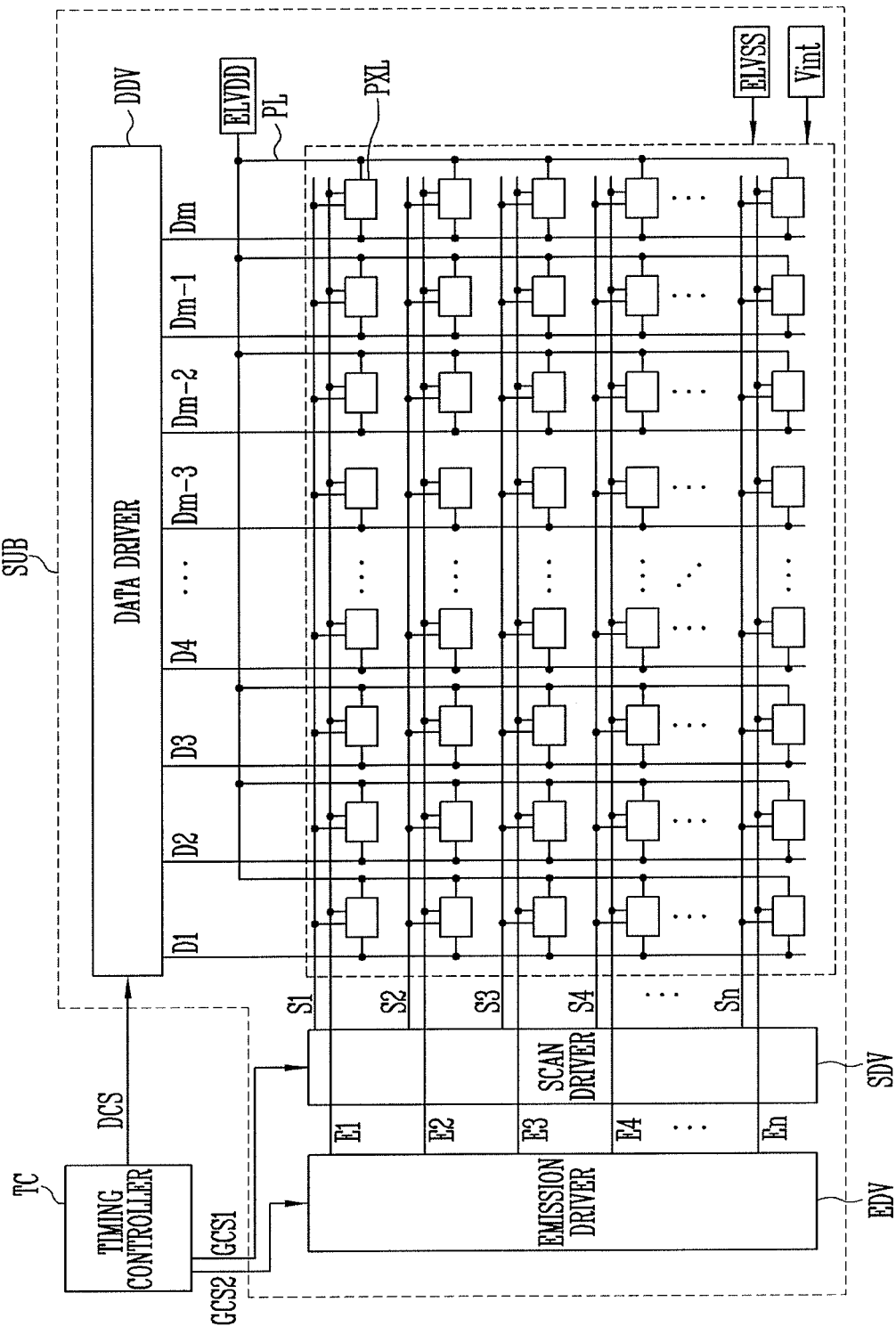
FIG. 2 illustrates an embodiment of a display device.

FIG. 2 illustrates an embodiment of a display device which includes pixels PXL, the driver, and the wiring unit. The driver includes the scan driver SDV, the emission driver EDV, the data driver DDV, and the timing controller TC. The positions of the scan driver SDV, the emission driver EDV, the data driver DDV, and the timing controller TC are illustratively shown, but may be in different locations in another embodiment.

Referring to FIG. 2, the display device the wiring unit provides signals to respective pixels PXL from the driver. The wiring unit includes scan lines, data lines, emission control lines, a power line PL, and an initialization power line. The scan lines include a plurality of scan lines S1 to Sn, the emission control lines include a plurality of emission control lines E1 to En, the data lines D1 to Dm, and the power line PL may be connected to each pixel PXL.

The pixels PXL are in the pixel area PXA (e.g., see FIG. 1). The pixels PXL are connected to the scan lines S1 to Sn, the emission control lines E1 to En, and the data lines D1 to Dm. When scan signals are supplied from the scan lines S1 to Sn, the pixels PXL may receive data signals from the data lines D1 to Dm. The pixels PXL receiving the data signals control the quantity of current flowing from a first power source ELVDD to a second power source ELVSS via an organic light emitting diode.

The scan driver SDV supplies scan signals to the scan lines S1 to Sn based on a first gate control signal GCS1 from the timing controller TC. For example, the scan driver SDV may sequentially supply the scan signals to the scan lines S1 to Sn. When the scan signals are sequentially supplied to the scan lines S1 to Sn, the pixels PXL are sequentially selected in the unit of a horizontal line.

The emission driver EDV supplies emission control signals to the emission control lines E1 to En based on a second gate control signal GCS from the timing controller TC. For example, the emission driver EDV may sequentially supply the emission control signals to the emission control lines E1 to En. The emission control signal may have a greater width than that of the scan signal. For example, an emission control signal supplied to an $i^{th}$ emission control line Ei (i is a natural number) may overlap a scan signal supplied to an $i-1^{th}$ scan line Si−1 and a scan signal supplied to an $i^{th}$ scan line Si by at least a part of a time period.

In addition, the emission control signal may be set with a gate-off voltage (for example, a voltage with a high level) so that transistors in the pixels PXL may be turned off. The scan signal may have a gate-on voltage (for example, a voltage with a low level) so that the transistors in the pixels PXL may be turned on.

The data driver DDV supplies data signals to the data lines D1 to Dm based on a data control signal DCS. The data signals supplied to the data lines D1 to Dm are supplied to the pixels PXL selected by the scan signals.

The timing controller TC supplies gate control signals GCS1 and GCS2 generated based on timing signals (e.g., supplied from an external source) to the scan driver SDV and the emission driver EDV and supplies the data control signal DCS to the data driver DDV.

Each of the gate control signals GCS1 and GCS2 includes a start pulse and clock signals. The start pulse controls a timing of the first scan signal or the first emission control signal. The clock signals are used for shifting the start pulse. The data control signal DCS includes a source start pulse and clock signals. The source start signal controls a sampling start time of data. The clock signals control a sampling operation.

Figure 3:
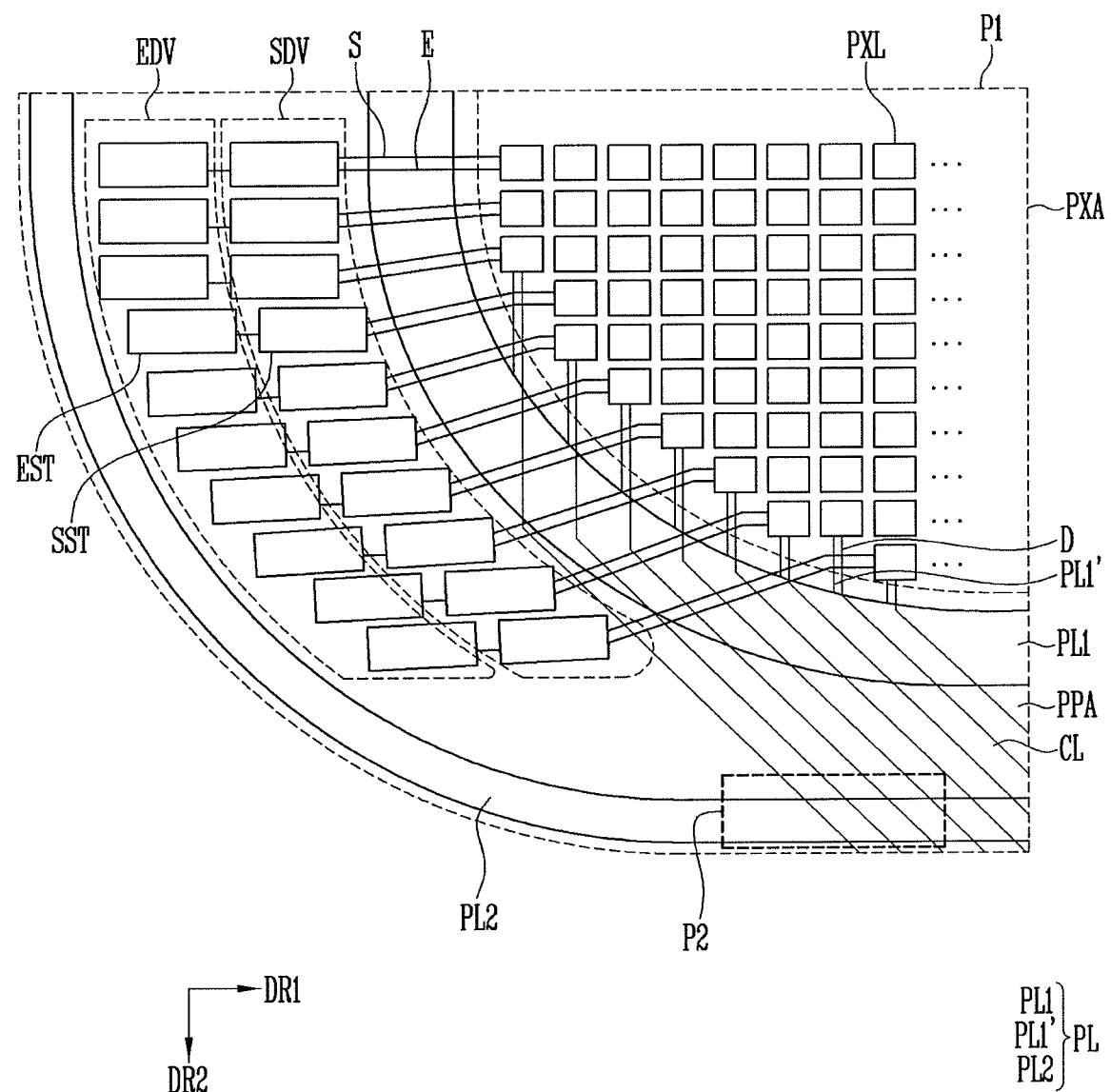
FIG. 3 illustrates an embodiment of a portion of pixels in the display device.

FIG. 3 illustrates an embodiment of a top plan view of a portion P1 of the pixels PXL in FIG. 1 and a connection relation between the pixels, the wiring unit, and the driver. The area P1 corresponds to a portion of a lower end of the pixel area and a portion of the lower end of the peripheral area.

Referring to FIG. 3, a connection relation between scan lines S, emission control line E, data lines D, and power lines PL for the pixels PXL Referring to FIGS. 1 and 3, a substrate SUB is divided into a pixel area PXA and a peripheral area PPA, and a plurality of pixels PXL are disposed within the pixel area PXA.

Each of the pixels PXL may include a plurality of pixel rows arranged in a first direction DR1. Each pixel row may extend in a second direction DR2 parallel to the first direction DR1. Each pixel PXL may include a plurality of pixel columns in the second DR2. Each pixel column may extend in the first direction DR1 parallel to the second direction DR2. Thus, the pixels PXL may be disposed in a predetermined matrix form.

The pixel area PXA has straight and curve sides and has a curve side at a corner portion. Only one side portion of the pixel area PXA is illustrated, but the other side portion of the pixel area PXA may substantially be formed in the same scheme so that the shape of the pixel area PXA is bilaterally symmetric.

A driver may be within the peripheral area PPA. A wiring unit may connect the pixels PXL and the driver. The driver includes a scan driver SDV connected with the pixels PXL through the scan lines S. The scan driver SDV is adjacent to pixel area PXA.

The scan driver SDV according to the exemplary embodiment of the present disclosure includes a plurality of scan stages SST. Each of the scan stages SST is connected to any one of the scan lines S. The scan lines S are connected with an output terminal of the scan stages SST and a scan signal input terminal of an outermost pixel in the pixel row, and the scan stage SST are driven based on a clock signal. The scan stages SST may substantially be implemented with the same circuit.

The scan driver SDV may have a shape bent to correspond to the corner portion of the pixel area PXA. For example, the scan stages SST may be along a border of the pixel area PXA. Each scan stage SST may correspond to a corresponding one of the pixel rows in the pixel area PXA. The scan signal may be supplied to the pixels PXL in each corresponding pixel row.

The scan lines S in the pixel area PXA may be parallel to the first direction DR1. For example, the output terminal of the scan stage SST and the scan signal input terminal of the outermost pixel in the pixel row may have the same position in the second direction DR2. The scan lines S in the peripheral area PPA may be parallel to the first direction DR1 or may be inclined to the first direction DR1.

The driver may include an emission driver EDV connected to the pixels PXL. The emission driver EDV is adjacent to the scan driver SDV. The scan driver SDV may be between the emission driver EDV and the pixel area PXA. Thus, the emission driver EDV may be at the outer side than the scan driver SDV.

The emission driver EDV includes a plurality of emission stages EST. The emission control lines E may connect an output terminal of the emission stage EST and an emission signal input terminal of the outermost pixel in the pixel row.

The emission driver EDV may have a shape bent to correspond to the corner portion of the pixel area PXA. For example, a virtual line connecting one end of each of the emission stages EST may include a curved line having a predetermined curvature.

Each emission stages EST may correspond to a respective one of the pixel rows in the pixel area PXA, and may supply the emission control signal to the pixels PXL in a corresponding pixel row.

The emission control lines E in the pixel area PXA may be parallel to the first direction DR1. For example, the output terminal of the first scan stage SST and the scan signal input terminal of the outermost pixel in the pixel row may have the same position in the second direction DR2.

A data driver DDV (e.g., see FIG. 1) may be in the peripheral area PPA. A corresponding data line D may be connected to each of the pixel columns. A plurality of data lines D are connected to the data driver DDV. The data lines D are connected only to the outermost pixels PXL in the respective pixel columns in FIG. 3. The data lines D may be connected to all of the pixels PXL in each pixel column in one embodiment, and the pixel PXL in the same column may share the same data line D.

The data lines D may extend in the second direction DR2 in the pixel area PXA. The data lines D may be connected with a plurality of connection lines CL, which substantially extend in the second direction DR2 in the peripheral area PPA.

The connection lines CL may be integrally provided, for example, with the data lines D. In one embodiment, the connection lines CL may be electrically connected with the data lines D through contact electrodes and the like. The connection lines CL may extend to be collected in a direction of the data driver DDV, and may configure a data line fan out unit having a shape spread from the data driver DDV in the pixel direction. The data lines D may therefore be connected to respective connection lines CL and may receive data signals from the data driver DDV.

The power lines PL may be connected to respective pixel columns. Each power line PL may include auxiliary power lines PL1' in the pixel area PXA. A first power line PL1 is connected to the auxiliary power lines PL' in the peripheral area PPA. The first power line PL1 may have a greater width than those of the auxiliary power lines PL1' and may extend along the border of the pixel area PXA. The auxiliary power lines PL1' may be branched from the first power line PL1, and may be connected to the pixel column, respectively. The auxiliary power line PL1' and the first power line PL1 provide a first power source ELVDD (e.g., see FIG. 2) to the pixels PXL.

The auxiliary power lines PL1' may be connected, for example, only to the outermost pixels PXL in the respective pixel columns. In one embodiment, each auxiliary power line PL1' is connected to all of the pixels PXL in each pixel column. In one embodiment, the pixels PXL in the same column may share the same auxiliary power line PL1'.

The power line PL may include a second power line PL2 at an outer peripheral side of the emission driver EDV and may apply a second power source ELVSS (e.g., see FIG. 2). The second power line PL2 may have a greater width or less than the width of the first power line PL1. The second power line PL2 may be spaced apart from the first power line PL1 by a predetermined interval.

The first power line PL1 and the second power line PL2 may extend in the peripheral area PPA along the border of the pixel area PXA. The first power line PL1 and the second power line PL2 may have a curve shape. The first and second power lines PL1 and PL2 may have a different shape (e.g., a straight shape) in another embodiment. The first power line PL1 and the second power line PL2 may have a shape bent at a right angle at a corner of the display area PXA, but may have a curve shape with a predetermined curvature in an exemplary embodiment. Further, each of the first power line PL1 and the second power line PL2 may have the same predetermined width or may have different widths.

Figure 4:
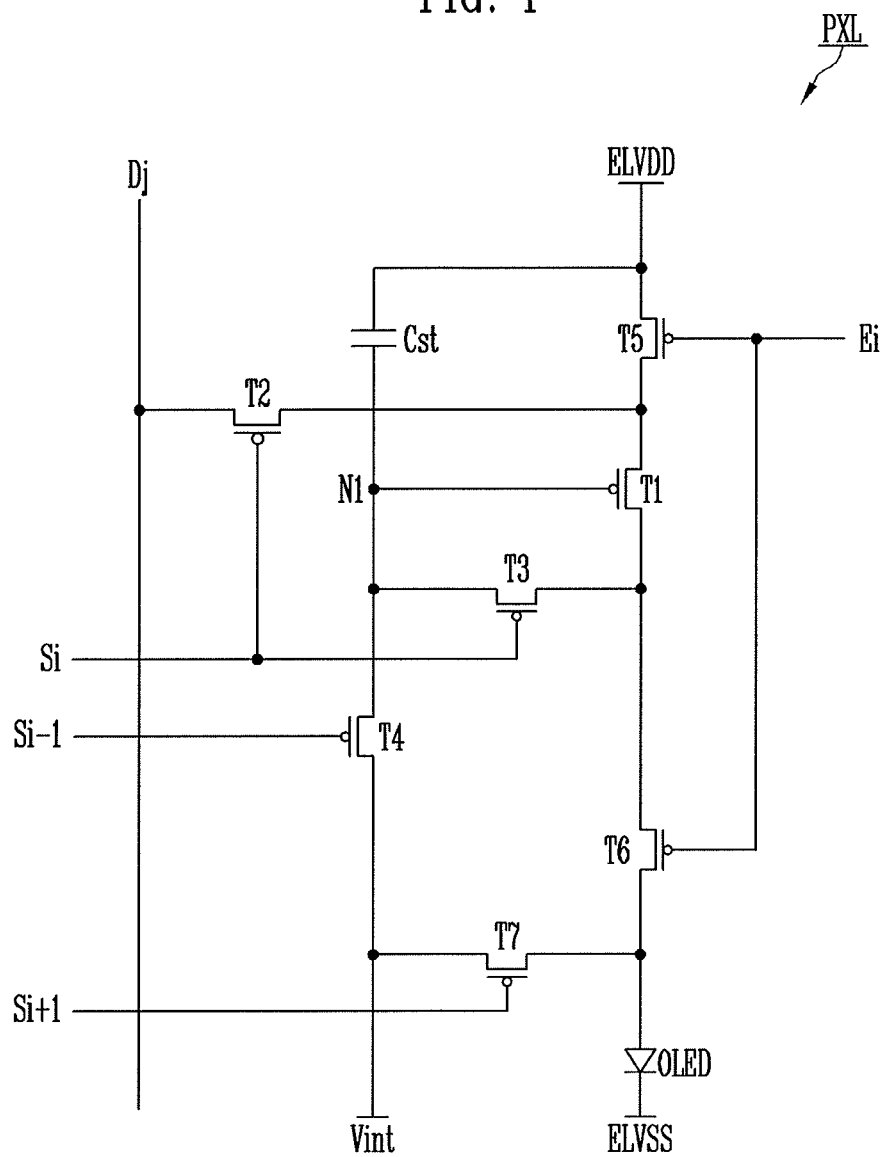
FIG. 4 illustrates an embodiment of a pixel.

FIG. 4 illustrates an embodiment of a pixel PXL, which may be representative of the pixels in FIG. 3. For illustrative purposes, the pixel PXL in FIG. 4 is connected to an $i^{th}$ data line Dj and an $i^{th}$ scan line Si.

Referring to FIG. 4, the pixel PXL includes an organic light emitting diode OLED, a first transistor T1 to a seventh transistor T7, and a storage capacitor Cst. The organic light emitting diode OLED has an anode electrode connected to the first transistor T1 via the sixth transistor T6 and a cathode electrode connected to the second power source ELVSS. The organic light emitting diode OLED generates light with predetermined luminance based on the quantity of current from the first transistor T1.

The seventh transistor T7 is connected between an initialization power source Vint and the anode electrode of the organic light emitting diode OLED. Further, a gate electrode of the seventh transistor T7 is connected to an $i+1^{th}$ scan line Si+1. The seventh transistor T7 is turned on when a scan signal is supplied to the $i+1^{th}$ scan line Sli+1 to supply a voltage of the initialization power source Vint to the anode electrode of the organic light emitting diode OLED. The initialization power source Vint may be set with a lower voltage than that of the data signal.

The sixth transistor T6 is connected between the first transistor T1 and the organic light emitting diode OLED. Further, a gate electrode of the sixth transistor T6 is connected to an $i^{th}$ emission control line Ei. The sixth transistor T6 is turned off when the emission control signal is supplied to the $i^{th}$ emission control line Ei and is turned on in one or more other cases.

The fifth transistor T5 is connected between the first power source ELVDD and first transistor T1. A gate electrode of fifth transistor T5 is connected to the $i^{th}$ emission control line Ei. The fifth transistor T5 is turned off when the emission control signal is supplied to the $i^{th}$ emission control line Ei and is turned on in one or more other cases.

The first transistor T1 (driving transistor) has a first electrode connected to the first pixel power source ELVDD via the fifth transistor T5, a second electrode connected to the anode electrode of the organic light emitting diode OLED via the sixth transistor T6, and a gate electrode connected to a first node N1. The first transistor T1 controls the quantity of current flowing from the first power source ELVDD to the second power source ELVSS, via the organic light emitting diode OLED, based on a voltage of the first node N1.

The third transistor T3 is connected between the second electrode of the first transistor T1 and the first node N1. A gate electrode of the third transistor T3 is connected to the $i^{th}$ scan line Si. The third transistor T3 may be turned on, when the scan signal is supplied to the $i^{th}$ scan line Si, to electrically connect the second electrode of the first transistor T1 and the first node N1. Accordingly, when the third transistor T3 is turned on, the first transistor T1 is placed in a diode-connected state.

The fourth transistor T4 is connected between the first node N1 and the initialization power source Vint. A gate electrode of the fourth transistor T4 is connected to the $i-1^{th}$ scan line Si-1. The fourth transistor T4 is turned on, when the scan signal is supplied to the $i-1^{th}$ scan line Si-1, to supply the voltage of the initialization power source Vint to the first node N1.

The second transistor T2 is connected between an $m^{th}$ data line Dm and the first electrode of the first transistor T1. A gate electrode of the second transistor T2 is connected to the $i^{th}$ scan line Si. The second transistor T2 is turned on when the scan signal is supplied to the $i^{th}$ scan line Si to electrically connect the $j^{th}$ data line Dj and the first electrode of the first transistor T1.

The storage capacitor Cst is connected between the first power source ELVDD and the first node N1. The storage capacitor Cst stores the data signal and a voltage corresponding to a threshold voltage of the first transistor T1.

Figure 5:
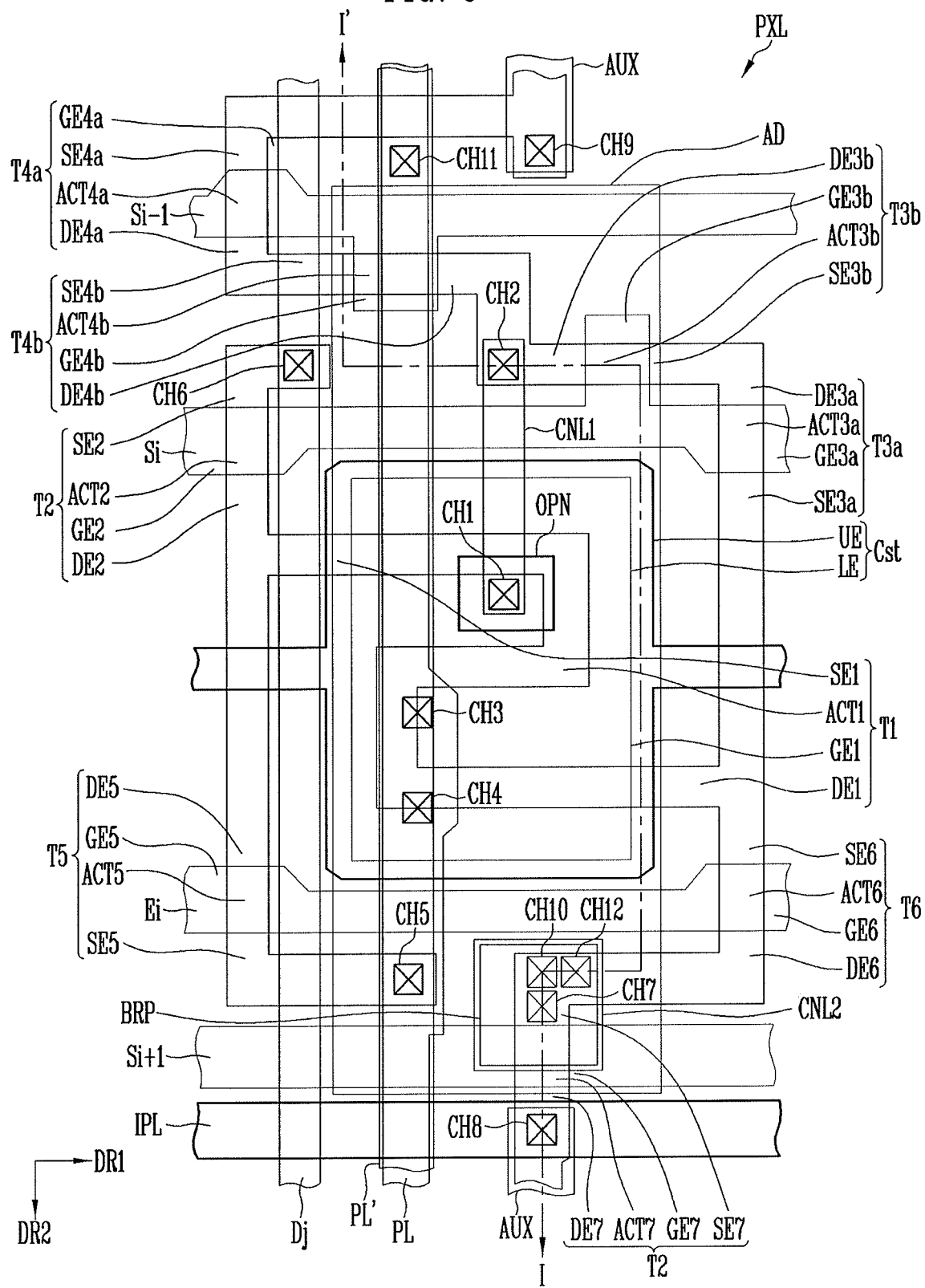
FIG. 5 illustrates an embodiment of a layout view of the pixel.
Figure 6:
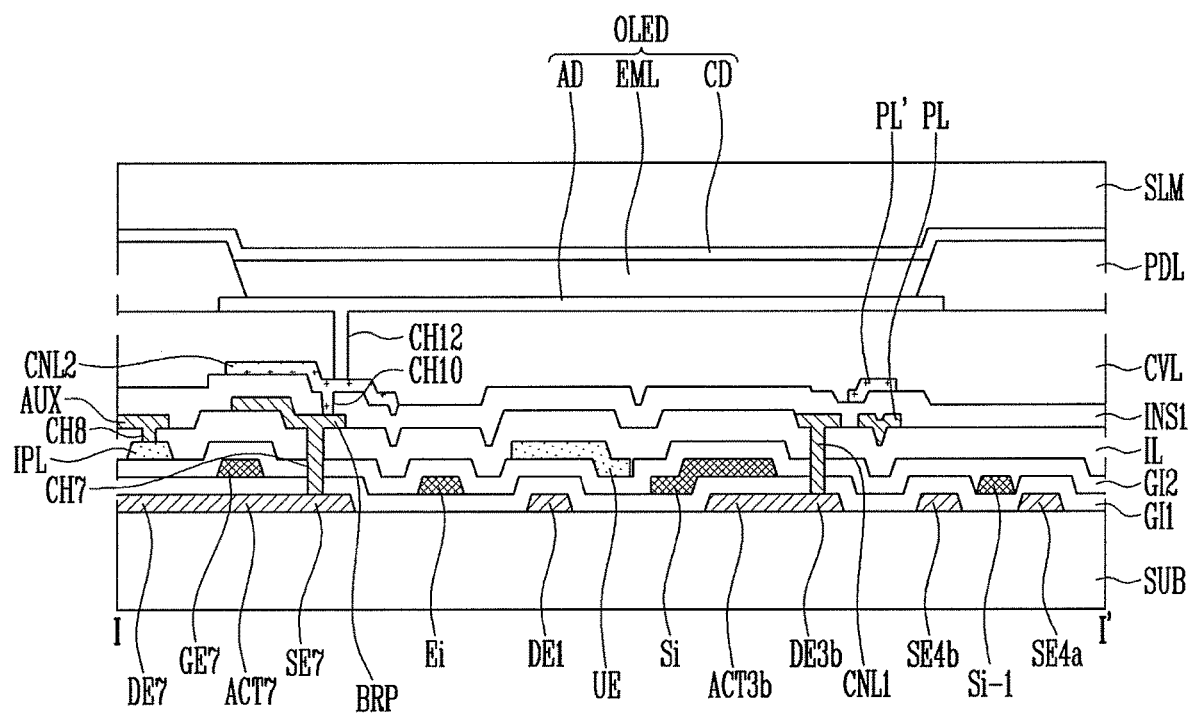
FIG. 6 illustrates a view taken along section line I-I' in FIG. 5.

FIG. 5 illustrates an embodiment of layout view of the pixel in FIG. 4, and FIG. 6 illustrates a cross-sectional view taken along line I-I' in FIG. 5. FIGS. 5 and 6 illustrate three scan lines Si-1, Si, and Si+1, the emission control line Ei, the power line PL, and the data line Dj connected to the pixel PXL for the one pixel PXL in an $i^{th}$ row and an $i^{th}$ column in the pixel area. For illustrative purposes, a scan line in an $i-1^{th}$ row is indicated with an scan line Si-1", a scan line in an $i^{th}$ row is indicated with an "$i^{th}$ scan line Si", a scan line in an $i+1^{th}$ row is indicated with an "$i+1^{th}$ scan line Si+1", an emission control line in an $i^{th}$ row is indicated with an "emission control line Ei", a data in a $j^{th}$ column is indicated with a "data line Dj", and a $i^{th}$ power line and a $i^{th}$ dummy power line are indicated with a "power line PL" and a dummy power line PL', respectively.

Referring to FIGS. 4 to 6, the display device includes a substrate 100, a wiring unit, and a plurality of pixels PXL. The substrate SUB may be an insulating material, such as glass and resin. The substrate SUB may be formed of a flexible material that bends or folds and may have a single-layer or multilayer structure.

For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. In another embodiment, the material of the substrate SUB may be different, e.g., Fiber Glass Reinforced Plastic (FRP) or another material.

The wiring unit provides signals to pixels PXL. The wiring unit for pixel PXL in FIG. 4 includes scan lines Si-1, Si, and Si+1, a data line Dj, an emission control line Ei, a power line PL, an initialization power line IPL, and a dummy power line PL'. The scan lines Si-1, Si, and Si+1 include the $i-1^{th}$ scan line Si-1, the $i^{th}$ scan line Si, and the $i+1^{th}$ scan line Si+1 extend in a first direction DR1 and are sequentially arranged in a second direction DR2. Scan signals are applied to the scan lines Si-1, Si, and Si+1, and an $i-1^{th}$ scan signal is applied to the $i-1^{th}$ scan line Si-1, an $i^{th}$ scan signal is applied to the $i^{th}$ scan line Si, and an i+1th scan signal is applied to the $i+1^{th}$ scan line Si+1.

The emission control line Ei extend in the first direction DR1 and are between the $i^{th}$ scan line Si and the $i+1^{th}$ scan line Si+1 so as to be spaced apart from the $i^{th}$ scan line Si and the i+1$^{th}$ scan line Si+1. An emission control signal is applied to the emission control line Ei.

The data line Dj extends in the second direction DR2 and is sequentially arranged in the first direction DR1. A data signal is applied to the data line Dj.

The power line PL is in the second direction DR2 and spaced apart from the data line Dj. A first power source ELVDD is applied to the power line PL.

The dummy power line PL' overlaps the power line PL and is connected with the power line PL, so that the same first power source ELVDD is applied through an eleventh contact hole CH11.

The initialization power line IPL extends in the first direction DR1 and is between the i+1$^{th}$ scan line Si+1 and the i−1$^{th}$ scan line Si−1 of the pixel in a next row. An initialization power source Vint is applied to the initialization power line IPL.

Each pixel PXL includes a first transistor T1 to a seventh transistor T7, a storage capacitor Cst, and a light emitting diode OLED. The first transistor T1 includes a first gate electrode GE1, a first active pattern ACT1, a first source electrode SE1, a first drain electrode DE1, and a first contact line CNL1. The first gate electrode GE1 is connected with a third drain electrode DE3 of the third transistor T3 and a fourth drain electrode DE4 of the fourth transistor T4. The first contact line CNL1 connects the first gate electrode GE1 and the third drain electrode DE3 and the fourth drain electrode DE4. The first contact line CNL1 has one end connected with the first gate electrode GE1 through a first contact hole CH1 and another end connected to the third drain electrode DE3 and the fourth drain electrode DE4 through a second contact hole CH2.

In one exemplary embodiment, the first active pattern ACT1 and the first source electrode SE1 and the first drain electrode DE1 may be formed of a semiconductor layer, in which impurities are not doped or are doped. The first source electrode SE1 and the first drain electrode DE1 may be formed of a semiconductor layer doped with impurities. The first active pattern ACT1 may be formed of a semiconductor layer which is not doped with impurities.

The first active pattern ACT1 may have, for example, a rod shape that extends in a predetermined direction and may have a shape bent several times in an extended longitudinal direction. The first active pattern ACT1 overlaps the first gate electrode GE1 when viewed on a plane. The first active pattern ACT1 is elongated to increase the length of a channel region of the first transistor T1. This may increase the driving range of a gate voltage for the first transistor T1. Accordingly, the gray levels of light emitted from the light emitting diode OLED may be finely controlled.

The first source electrode SE1 is connected to one end of the first active pattern ACT1 and with a second drain electrode DE2 of the second transistor T2 and a fifth drain electrode DE5 of the fifth transistor T5. The first drain electrode DE1 is connected to the other end of the first active pattern ACT1 and with a third source electrode SE3 of the third transistor T3 and a sixth source electrode SE6 of the sixth transistor T6.

The second transistor T2 includes a second gate electrode GE2, a second active pattern ACT2, a second source electrode SE2, and the second drain electrode DE2. The second gate electrode GE2 is connected to the i$^{th}$ scan line Si. The second gate electrode GE2 is provided as a part of the i$^{th}$ scan line Si or is provided in a shape protruding from the i$^{th}$ scan line Si. In the exemplary embodiment, the second active pattern ACT2 and the second source electrode SE2 and the second drain electrode DE2 may be formed of a semiconductor layer, in which impurities are not doped or are doped.

The second source electrode SE2 and the second drain electrode DE2 may be formed of a semiconductor layer doped with impurities. The second active pattern ACT2 may be formed of a semiconductor layer which his not doped with impurities. The second active pattern ACT2 corresponds to a portion overlapping the second gate electrode GE2. The second source electrode SE2 has one end connected to the second active pattern ACT2 and another end connected to the data line Dj through a sixth contact hole CH6. The second drain electrode DE2 has one end connected to the second active pattern ACT2 and another end connected to the first source electrode SE1 of the first transistor T1 and the fifth drain electrode DE5 of the fifth transistor T5.

The third transistor T3 may have a dual-gate structure for preventing leakage current. For example, the third transistor T3 may include a 3a transistor T3a and a 3b transistor T3b. The 3a transistor T3a may include a 3a gate electrode GE3a, a 3a active pattern ACT3a, a 3a source electrode SE3a, and a 3a drain electrode DE3a, and the 3b transistor T3b may include a 3b gate electrode GE3b, a 3b active pattern ACT3b, a 3b source electrode SE3b, and a 3b drain electrode DE3b. The 3a gate electrode GE3a and the 3b gate electrode GE3b may be referred to as a third gate electrode GE3. The 3a active pattern ACT3a and the 3b active pattern ACT3b may be referred to as a third active pattern ACT3. The 3a source electrode SE3a and the 3b source electrode SE3b may be referred to as a third source electrode SE3. The 3a drain electrode DE3a and the 3b drain electrode DE3b may be referred to as a third drain electrode DE3.

The third gate electrode GE3 is connected to the i$^{th}$ scan line S1 and is provided as a part of the i$^{th}$ scan line Si or has a shape protruding from the i$^{th}$ scan line Si. In one exemplary embodiment, the third active pattern ACT3 and the third source electrode SE3 and the third drain electrode DE3 may be formed of a semiconductor layer, in which impurities are not doped or are doped. The third source electrode SE3 and the third drain electrode DE3 may be formed of a semiconductor layer doped with impurities. The third active pattern ACT3 may be formed of a semiconductor layer not doped with impurities.

The third active pattern ACT3 corresponds to a portion overlapping the third gate electrode GE3. The third source electrode SE3 has one end connected to the third active pattern ACT3 and another end connected with the first drain electrode DE1 of the first transistor T1 and the sixth source electrode SE6 of the sixth transistor T6. The third drain electrode DE3 has one end connected to the third active pattern ACT3 and another end connected to the fourth drain electrode DE4 of the fourth transistor T4. The third drain electrode DE3 is also connected to the first gate electrode GE1 of the first transistor T1 through the first contact line CNL1, the second contact hole CH2, and the first contact hole CH1.

The fourth transistor T4 has a dual-gate structure for preventing leakage current. The fourth transistor T4 may include, for example, a 4a transistor T4a and a 4b transistor T4b. The 4a transistor T4a may include a 4a gate electrode GE4a, a 4a active pattern ACT4a, a 4a source electrode SE4a, and a 4a drain electrode DE4a, and the 4b transistor T4b may include a 4b gate electrode GE4b, a 4b active pattern ACT4b, a 4b source electrode SE4b, and a 4b drain electrode DE4b. The 4a gate electrode GE4 and the 4b gate electrode GE4b may be referred to as a fourth gate electrode GE4. The 4a active pattern ACT4a and the 4b active pattern ACT4b may be referred to as a fourth active pattern ACT4. The 4a source electrode SE4a and the 4b source electrode SE4b may be referred to as a fourth source electrode SE4. The 4a drain electrode DE4a and the 4b drain electrode DE4b may be referred to as a fourth drain electrode DE4.

The fourth gate electrode GE4 is connected to the i-1$^{th}$ scan line Si-1 and may be provided as a part of the i-1$^{th}$ scan line Si-1 or have a shape protruding from the i-1$^{th}$ scan line Si-1. The fourth active pattern ACT4, the fourth source electrode SE4, and the fourth drain electrode DE4 may be formed of a semiconductor layer, in which impurities are or are not doped. The fourth source electrode SE4 and the fourth drain electrode DE4 may be formed of a semiconductor layer, in which impurities are doped. The fourth active pattern ACT4 may be formed of a semiconductor layer, in which impurities are not doped. The fourth active pattern ACT4 corresponds to a portion overlapping the fourth gate electrode GE4. The fourth source electrode SE4 has one end connected to the fourth active pattern ACT4 and another end connected to the initialization power line IPL and a seventh drain electrode DE7 of the seventh transistor T7 of the pixel in a previous row.

An auxiliary connection line AUX is connected between the fourth source electrode SE4 and the initialization power line IPL, e.g., the auxiliary connection line AUX has one end connected to the fourth source electrode SE4 through a ninth contact hole CH9 and another end connected to the initialization power line IPL in a previous row through an eighth contact hole CH8 in the previous row. The fourth drain electrode DE4 has one end connected to the fourth active pattern ACT4 and another end connected to the third drain electrode DE3 of the third transistor T3. The fourth electrode DE4 is also connected to the first gate electrode GE1 of the first transistor T1 through the first contact line CNL1, the second contact hole CH2, and the first contact hole CH1.

The fifth transistor T5 includes a fifth gate electrode GE5, a fifth active pattern ACT5, a fifth source electrode SE5, and the fifth drain electrode DE5. The fifth gate electrode GE5 is connected to the emission control line EL and is provided as a part of the emission control line Ei or has a shape protruding from the emission control line Ei. The fifth active pattern ACT5, the fifth source electrode SE5, and the fifth drain electrode DE5 may be formed of a semiconductor layer, in which impurities are not doped or are doped. The fifth source electrode SE5 and the fifth drain electrode DE5 may be formed of a semiconductor layer, in which impurities are doped.

The fifth active pattern ACT5 may be formed of a semiconductor layer, in which impurities are not doped. The fifth active pattern ACT5 corresponds to a portion overlapping the fifth gate electrode GE5.

The fifth source electrode SE5 has one end connected to the fifth active pattern ACT5 and another end connected to the power line PL through a fifth contact hole CH5. The fifth drain electrode DE5 has one end connected to the fifth active pattern ACT5 and another end connected to the first source electrode SE1 of the first transistor T1 and the second drain electrode DE2 of the second transistor T2.

The sixth transistor T6 includes a sixth gate electrode GE6, a sixth active pattern ACT6, the sixth source electrode SE6, and the sixth drain electrode DE6. The sixth gate electrode GE6 is connected to the emission control line EL and has part of the emission control line Ei or has a shape protruding from the emission control line Ei. The sixth active pattern ACT6, the sixth source electrode SE6. The sixth drain electrode DE6 may be formed of a semiconductor layer, in which impurities are not doped or are doped. The sixth source electrode SE6 and the sixth drain electrode DE6 may be formed of a semiconductor layer, in which impurities are doped. The sixth active pattern ACT6 may be formed of a semiconductor layer, in which impurities are not doped. The sixth active pattern ACT6 corresponds to a portion overlapping the sixth gate electrode GE6.

The sixth drain electrode DE6 has one end connected to the sixth active pattern ACT6 and another end connected to the first drain electrode DE1 of the first transistor T1 and the third drain electrode DE3 of the third transistor T3. The sixth drain electrode DE6 has one end connected to the sixth active pattern ACT and another end connected to a seventh source electrode SE7 of the seventh transistor T7.

The seventh transistor T7 includes a seventh gate electrode GE7, a seventh active pattern ACT7, the seventh source electrode SE7, and the seventh drain electrode DE7. he seventh gate electrode GE7 is connected to the i+1$^{th}$ scan line Si+1. The seventh gate electrode GE7 is provided as a part of the i+1$^{th}$ scan line Si+1 or is provided in a shape protruding from the i+1$^{th}$ scan line Si+1. The seventh active pattern ACT7, the seventh source electrode SE7, and the seventh drain electrode DE7 may be formed of a semiconductor layer, in which impurities are not doped or are doped. The seventh source electrode SE7 and the seventh drain electrode DE7 may be formed of a semiconductor layer, in which impurities are doped. The seventh active pattern ACT7 may be formed of a semiconductor layer, in which impurities are not doped. The seventh active pattern ACT7 corresponds to a portion overlapping the seventh gate electrode GE7.

The seventh drain electrode DE7 has one end connected to the seventh active pattern ACT7 and another end connected to the sixth drain electrode DE6 of the sixth transistor T6. The seventh drain electrode DE7 has one end connected to the seventh active pattern ACT7 and another end connected to the initialization power line IPL. The seventh drain electrode DE7 is also connected to the fourth source electrode SE4 of the fourth transistor T4 of the pixel in a next row. The seventh drain electrode DE7 and the initialization power line IPL are connected through the dummy line PL', the eighth contact hole CH8, and the ninth contact hole CH9.

The storage capacitor Cst includes a lower electrode LE and an upper electrode UE. The lower electrode LE may be formed of the first gate electrode GE1 of the first transistor T1. The upper electrode UE overlaps the first gate electrode GE1 and covers the lower electrode LE when viewed on a plane. The capacitance of the storage capacitor Cst may be increased by increasing an overlapping area of the upper electrode UE and the lower electrode LE. The upper electrode UE may extend in the first direction DR1. In one exemplary embodiment, a voltage having the same level as that of the first power source ELVDD (e.g., see FIG. 2) may be applied to the upper electrode UE. The upper electrode UE has an opening OPN in a region, in which the first contact hole CH 1, through which the first gate electrode GE1 is in contact with the first contact line CNL1, is formed.

The light emitting diode OLED includes an emission layer EML between a first electrode AD and a second electrode CD. The first electrode AD may be anode electrode and the second electrode CD may be cathode electrode. The first electrode AD is within the pixel area corresponding to each pixel PXL. The first electrode AD is connected to the seventh source electrode SE7 of the seventh transistor T7 and the sixth drain electrode DE6 of the sixth transistor T6 through a seventh contact hole CH7 and a tenth contact hole CH10. A bridge pattern BRP and a second contact line CNL2 are between the seventh contact hole CH7 and the tenth contact hole CH10 to connect the sixth drain electrode DE6, the seventh source electrode SE7, and the first electrode AD.

In FIGS. 5 and 6, the active patterns ACT1 to ACT7 (ACT) are on the substrate SUB. The active pattern ACT includes the first active pattern ACT1 to the seventh active pattern ACT7 that are formed of a semiconductor material. A buffer layer may be between the substrate SUB and the first to the seventh active pattern ACT1 to ACT7.

A first gate insulating layer GI1 is on the substrate SUB, on which the first active pattern ACT1 and the seventh active pattern ACT7 are formed. The $i-1^{th}$ scan line Si−1 to the $i+1^{th}$ scan line Si+1, the emission control line Ei, the first gate electrode GE1, and the seventh gate electrode GE7 are on the first gate insulating layer GI1. The first gate electrode GE1 serves as the lower electrode LE of the storage capacitor Cst. The second gate electrode GE2 and the third gate electrode GE3 may be integrally formed with the $i^{th}$ scan line Si. The fourth gate electrode GE4 may be integrally formed with the $i-1^{th}$ scan line Si−1 The firth gate electrode GE5 and the sixth gate electrode GE6 may be integrally formed with the emission control line Ei. The seventh gate electrode may be integrally formed with the $i+1^{th}$ scan line Si+1.

A second gate insulating layer GI2 is on the substrate SUB, on which the $i-1^{th}$ scan line Si−1 and the like are formed. The upper electrode UE of the storage capacitor Cst and the initialization power line IPL are on the second gate insulating layer GI2. The upper electrode UE covers the lower electrode LE of the storage capacitor Cst, and the second gate insulating layer GI2 is therebetween.

An interlayer insulating layer IL is on the substrate SUB, on which the upper electrode UE and the like are formed.

The data line Dj, the power line PL, the first contact line CNL1, the auxiliary connection line AUX, and the bridge pattern BRP are on interlayer insulating layer IL. The data line Dj is connected to the second source electrode SE2 through the sixth contact hole CH6, which passes through the first gate insulating layer GI1, the second gate insulating layer GI2, and the interlayer insulating layer IL.

The power line PL is connected to the upper electrode UE of the storage capacitor Cst through third and fourth contact holes CH3 and CH4 passing through the interlayer insulating layer IL. Further, the power line PL is connected to the fifth source electrode SE5 through the fifth contact hole CH5, which passes through the first gate insulating layer GI1, the second gate insulating layer GI2, and the interlayer insulating layer IL.

The first contact line CNL1 is connected to the first gate electrode GE1 through the first contact hole CH1 passing through the second gate insulating layer GI2 and the interlayer insulating layer IL. Further, the first contact line CNL1 is connected to the third drain electrode DE3 and the fourth drain electrode DE4 through the second contact hole CH2, which passes through the first gate insulating layer GI1, the second gate insulating layer GI2, and the interlayer insulating layer IL.

The auxiliary connection line AUX is connected to the initialization power line IPL through the eighth contact hole which passes through the interlayer insulating layer IL. Further, the auxiliary connection line AUX is connected to the fourth source electrode SE4 and a seventh drain electrode DE7 of a previous row through the ninth contact hole CH9, which passes through the first gate insulating layer GI1, the second gate insulating layer GI2, and the interlayer insulating layer IL.

The bridge pattern BRP is a pattern connecting the sixth drain electrode DE6 and the first electrode AD between the sixth drain electrode DE6 and the first electrode AD, The bring pattern BRP is connected to the sixth drain electrode DE6 and the seventh source electrode SE7 through the seventh contact hole CH7, which passes through the first gate insulating layer GI1, the second gate insulating layer GI2, and the interlayer insulating layer IL.

A first insulating layer INS1 is on the substrate SUB, on which the data line Dj and the like are formed.

The dummy power line PL' and the second contact line CNL2 are on the first insulating layer INS1. The dummy power line PL' stably supplies the first power source ELVDD (e.g., see FIG. 1) to the power line PL without a delay and decreases resistance applied to the power line PL. The dummy power line PL' may extend in the second direction DR2 and may overlap the power line PL'. The dummy power line PL' is connected to the power line PL through the eleventh contact hole CH11 passing through the first insulating layer INS1.

The second contact line CNL2 is connected to the bridge pattern BRP through the tenth contact hole CH10 passing through the first insulating layer INS1.

A cover layer CVL is disposed on the substrate SUB, on which the dummy power line PL' and the like are formed.

The first electrode AD is on the cover layer CVL and is connected to the second contact line CNL2 through a twelfth contact hole CH12 passing through the cover layer CVL. The second contact line CNL2 is connected to the bridge pattern BRP through the tenth contact hole CH10, so that the first electrode AD is finally connected to the sixth electrode DE6 and the seventh source electrode SE7 through the bridge pattern BRP.

A pixel defining layer PDL divides the pixel area PXA and corresponds to a respective pixel PXL is on the substrate SUB on which the first electrode AD is formed. The pixel defining layer PDL may protrude from the substrate SUB along a circumference of the pixel PXL while exposing an upper surface of first electrode AD.

The emission layer EML is in the pixel area PXA surrounded by the pixel defining layer PDL. The second electrode CD is on the emission layer EML. A sealing layer SLM covering the second electrode CD is on the second electrode CD.

Figure 7:
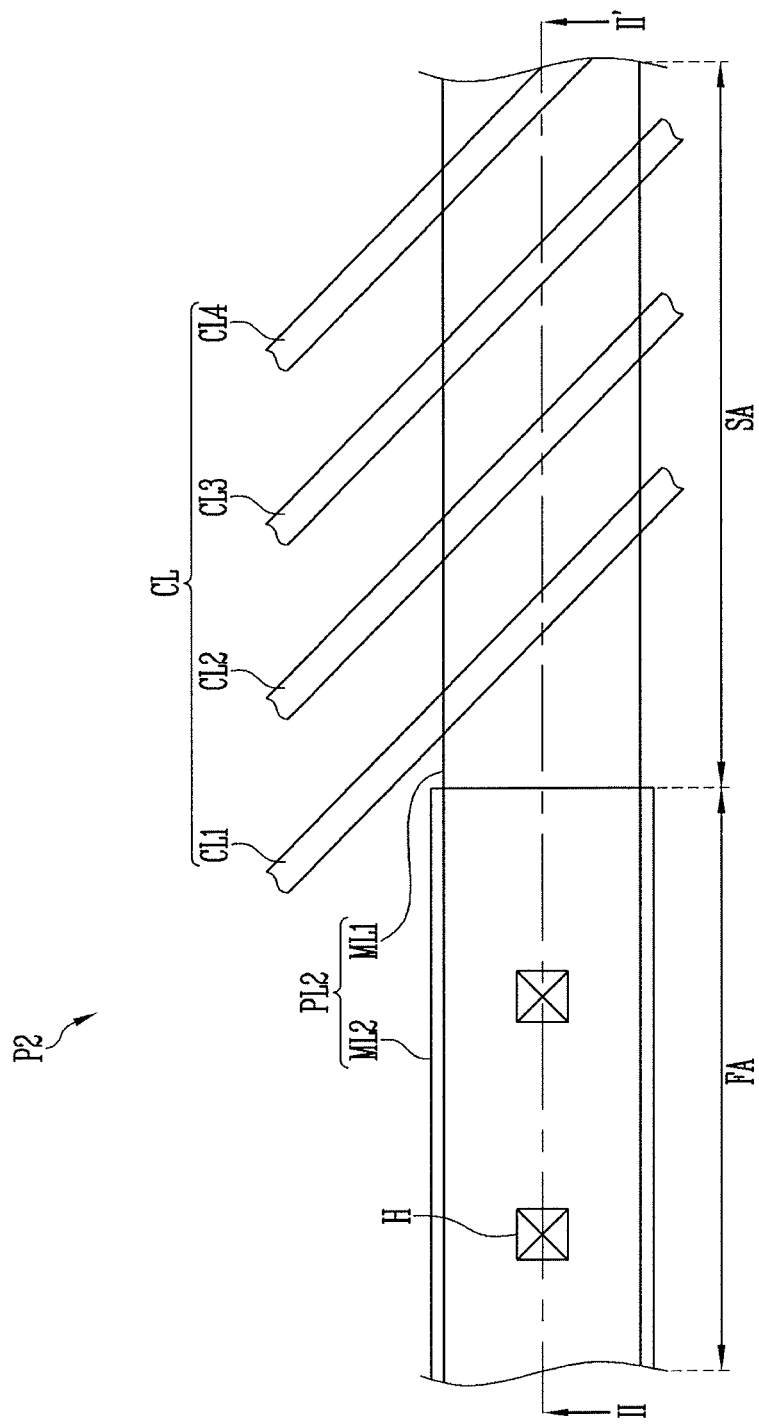
FIG. 7 illustrates an embodiment of a pixel P2 and a second power line.
Figure 8:
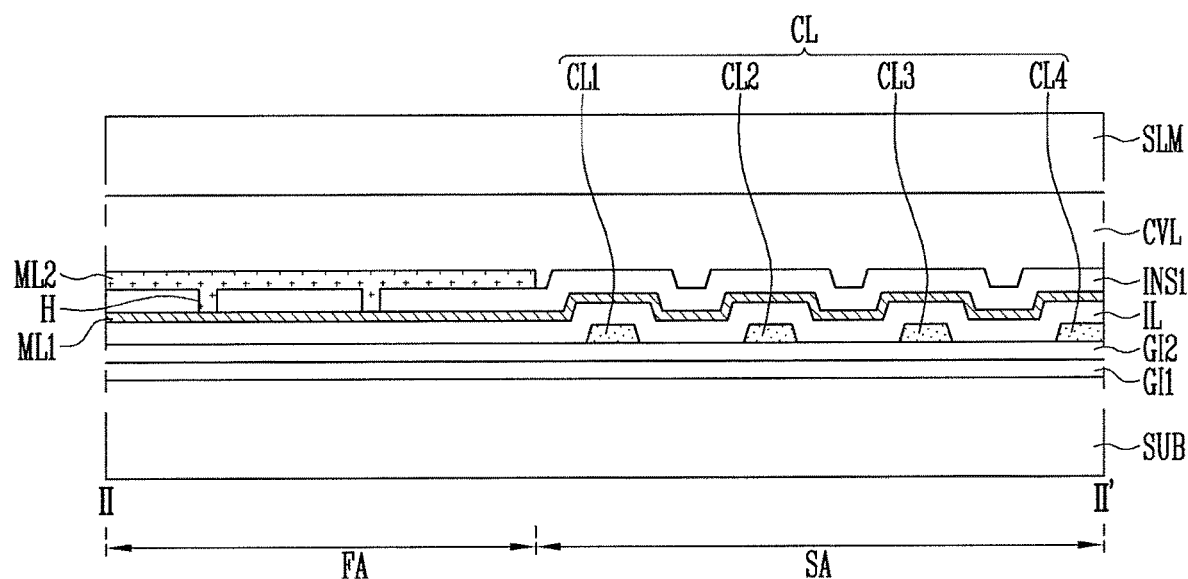
FIG. 8 illustrates a view taken along section line II-IP in FIG. 7.

FIG. 7 is a top plan view illustrating an embodiment of a portion corresponding to P2 of FIG. 3. FIG. 7 also illustrates a second power line. FIG. 8 illustrates a cross-sectional view taken along line II-IP in FIG. 7. FIGS. 7 and 8 illustrate a connection relation between the respective lines in the peripheral area of the substrate according to one embodiment. The second power line and the connection line are illustrated as an example. The second power line and the connection line are illustrated as "the second power line PL2" and "the connection line CL", respectively. Only part of the wiring units is illustrated, but scan lines, emission control lines, data lines, and first power line may be additionally as described below.

A connection relation for each line will be described with reference to FIGS. 3, 7, and 8.

A second power line PL2 and a connection line CL may be provided in a peripheral area PPA of a substrate SUB and may partially overlap.

The connection line CL may include a plurality of connection lines CL1, CL2, CL3, and CL4. The connection lines CL1, CL2, CL3, and CL4 may extend in an inclined direction with respect to the second power line PL2 when viewed on a plane. Each of the connection lines CL1, CL2, CL3, and CL4 may be electrically connected to a data line D in a pixel area PXA of the substrate SUB. The connection lines CL1, CL2, CL3, and CL4 may be integrally provided with the data line D and, for example, may extend from the pixel area PXA to the peripheral area PPA. For example, each of the connection lines CL1, CL2, CL3, and CL4 may be electrically connected with the data line D through a contact electrode.

The second power line PL2 may be at an external side of the emission driver EDV in the peripheral area PPA. The second power line PL2 is a line providing a second power source ELVSS (e.g., see FIG. 2) to the pixel area PXA and may have a greater width than that of the connection line CL.

The second power line PL2 may include a first area FA and a second area SA. The first area FA may not overlap the connection line CL and the second area SA may overlap the connection line CL. In the first area FA, the second power line PL2 may be formed in dual layers including a first metal layer ML1 and a second metal layer ML2. In the first area FA, the first metal layer ML1 and the second metal layer ML2 may be electrically connected with each other through a contact hole H. Accordingly, the resistance of the second power line PL2 is decreased, so that it is possible to stably supply the second power source ELVSS (e.g., see FIG. 2) to the second power line PL2 without a delay. When viewed on a plane, the first metal layer ML1 and the second metal layer ML2 may have different widths or the same widths.

In the second area SA, the second power line PL2 may be formed so as to include only the first metal layer ML1. In the second area SA, the second power line PL2 may include only the first metal layer ML1. For example, the second area SA of the second power line PL2 may not include the second metal lay ML2. Accordingly, in the second area SA, the first metal layer ML1 and the second metal layer ML2 may not be electrically connected.

A embodiment of the structure of the wiring unit in the peripheral area PPA will now be described according to a lamination sequence. First, the substrate SUB may be provided. A first gate insulating layer GI1 and a second gate insulating layer GI2 may be sequentially disposed on the substrate SUB. The connection line CL may be disposed on the second gate insulating layer GI2.

An interlayer insulating layer IL for covering the connection line CL may be disposed on the connection line CL. The connection line CL may include the connection lines CL1, CL2, CL3, and CL4. The connection lines CL1, CL2, CL3, and CL4 may be on the same layer, or some of the connection lines CL1, CL2, CL3, and CL4 may be disposed on the first gate insulating layer GI and remaining ones of the connection lines CL1, CL2, CL3, and CL4 may be on the second gate insulating layer GI2. (A structure in which the connection lines CL1, CL2, CL3, and CL4 are on different layers will be described below with reference to FIG. 11).

In one embodiment, the connection line CL may be disposed on the same layer as that of an upper electrode UE (e.g., see FIG. 6) of a storage capacitor Cst in the pixel area PXA and may be provided through the same process as that of the upper electrode UE (e.g., see FIG. 6) of the storage capacitor Cst. In one embodiment, the connection line CL may be disposed on the same layer as those of a scan line S and an emission control line E in the pixel area PXA, and may also be provided through the same process as those of the scan line S and the emission control line E.

The connection line CL may partially overlap the second power line PL2. For example, the connection line CL may overlap the second area SA of the second power line PL2, and may not overlap the first area FA of the second power line PL2.

The first metal layer ML1 may be disposed on the interlayer insulating layer IL and may be provided over all of the first area FA and the second area SA on the substrate SUB. The first metal layer ML1 may be disposed on the same layer as that of the data line D in the pixel area PXA, and may be provided through the same process as that of the data line D.

A first insulating layer INS1 may be disposed on the first metal layer ML1 and, for example, may be an inorganic insulating material including an inorganic material. The inorganic material may include a silicon nitride, a silicon oxide, a silicon oxynitride, and the like. The first insulating layer INS1 may include one or more contact holes H exposing a portion of the first metal layer ML1 to the outside. The contact hole H may be within the first insulating layer INS1 and correspond to the first area FA of the second power line PL2.

The second metal layer ML2 may be disposed on the first insulating layer INS1 and on the same layer as that of a second contact line CNL2 (e.g., see FIG. 6) in the pixel area PXA, and may be provided through the same process as that of the second contact line CNL2.

The second metal layer ML2 may be provided only in the first area FA of the second power line PL2 on the substrate SUB, and may cover the first metal layer ML1 provided in the first area FA. The second metal layer ML2 may not be provided in the second area SA overlapping the connection line CL.

In the first area of the second power line PL2, the second metal layer ML2 may be electrically connected with the first metal layer ML1 through the contact hole H of the first insulating layer INS1.

A cover layer CVL covering the second metal layer ML2 may be disposed on the substrate SUB on which the second metal layer ML2 is provided.

A sealing layer SLM may be disposed on the cover layer CVL.

Part of the first insulating layer INS1 and part of the interlayer insulating layer IL may have curve forms including a step portion by the connection line CL. The connection line CL is not provided under the remaining part of the first insulating layer INS1 and the remaining part of the interlayer insulating layer IL. Thus, the remaining part of the first insulating layer INS1 and the remaining part of the interlayer insulating layer IL may have flat forms including no step portion.

For example, the first insulating layer INS1 between the first metal layer ML1 and the second metal layer ML2 may include both the curve form including the step portion and the flat form including no step portion. The first insulating layer INS1 having the curve form including the step portion may correspond to the second area SA of the second power line PL2. The first insulating layer INS2 having the flat form including no step portion may correspond to the first area FA of the second power line PL2. The first insulating layer INS2 having the flat form including no step portion may include the contact hole H.

The contact hole H is provided only in the first insulating layer INS2 having the flat form including no step portion. Thus, the first metal layer ML1 and the second metal layer ML2 may be electrically connected only in the first area FA of the second power line PL2. Accordingly, electrical connection of the first and second metal layers ML1 and ML2 in the second power line PL2 may not be influenced by the step portion generated by the connection line CL.

In order to establish electrical connection of the first and second metal layers ML1 and ML2, an etching process for forming the contact hole H may be performed on the first insulating layer INS1.

When the connection line overlaps both the first and second areas FA and SA of the second power line PL2, the first insulating layer INS1 and the first metal layer ML1 may have curve forms including a step portion generated by the connection line CL in the portions corresponding to the first and second areas FA and SA. The first metal layer ML1 having the aforementioned form may be vulnerable when the etching process for forming the contact hole H is performed. For example, when the etching process for forming the contact hole H is performed, part of the first metal layer ML1 corresponding to the step portion generated by the connection line CL may be over-etched. In this case, contact resistance of the first metal layer ML1 and the second metal layer ML2 may be increased. When a high voltage is applied, heat is generated that may damage the second power line PL2.

In one exemplary embodiment, the first and second metal layers ML1 and ML2 are electrically connected through the contact hole H only in the first area FA of the second power line PL2, which does not overlap the connection line CL. Thus, it may be possible to reduce or minimize defects of the second power line PL2.

Figure 9:
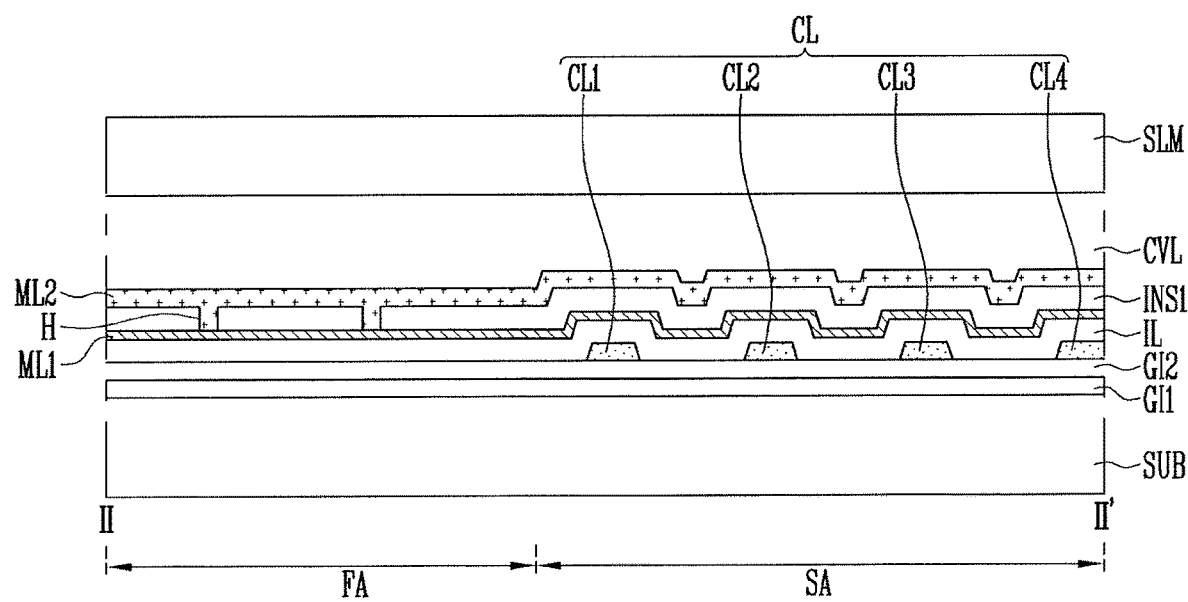
FIGS. 9 to 11 illustrate various embodiments of the second power line in FIG. 7.
Figure 10:
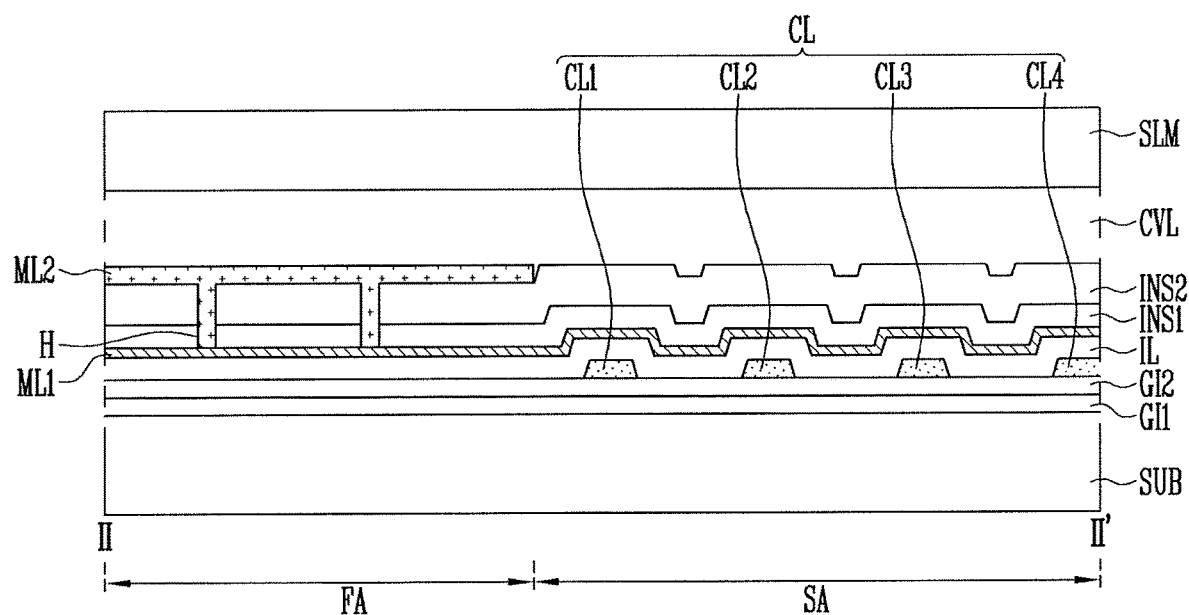
Figure 11:
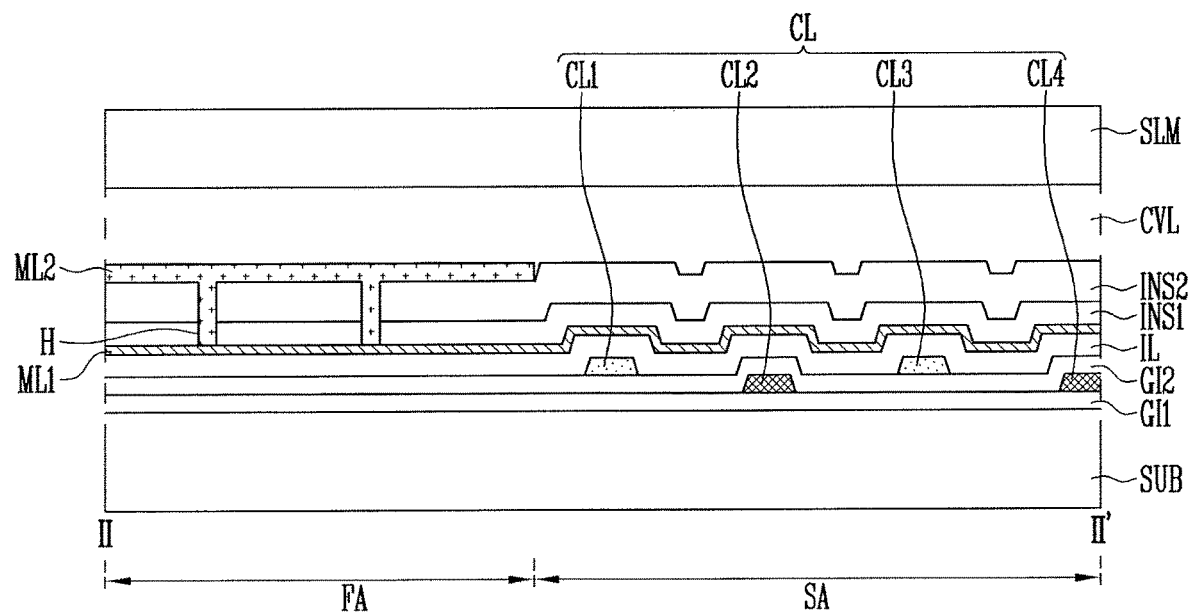

FIGS. 9 to 11 are cross-sectional views illustrating additional embodiments of the second power line in FIG. 7. A display device according to these additional embodiments may be the same as previous embodiments, except as indicated below.

Referring to FIGS. 7 and 9, a second power line PL2 and a connection line CL may be in a peripheral area PPA of a substrate SUB and may partially overlap. The second power line PL2 may include a first area FA and a second area SA. The first area FA may be an area which does not overlap the connection line CL. The second area SA may be an area which overlaps the connection line CL.

In the first and second areas FA and SA, the second power line PL2 may be formed in dual layers including a first metal layer ML1 and a second metal layer ML2. In the first area FA, the first metal layer ML1 and the second metal layer ML2 may be electrically connected with each other through a contact hole H of a first insulating layer INS1. Accordingly, resistance of the second power line PL2 is decreased, and thus it may be possible to stably supply a second power source ELVSS (e.g., see FIG. 2) to the second power line PL2 without delay.

The first insulating layer INS1 may include one or more contact holes H exposing a part of the first metal layer ML1 to the outside. The contact hole H may be within the first insulating layer INS1 and correspond to the first area FA of the second power line PL2.

In the second area SA, the first metal layer ML1 and the second metal layer ML2 of the second power line PL2 may overlap, with the first insulating layer INS1 therebetween.

Referring to FIGS. 7 and 10, a display device may include a second power line PL2 and a connection line CL in a peripheral area PPA of a substrate SUB. The second power line PL2 may include a first area FA and a second area SA. The first area FA may be an area which does not overlap the connection line CL. The second area SA may be an area which overlaps the connection line CL.

In the first area FA, the second power line PL2 may be formed in dual layers including a first metal layer ML1 and a second metal layer ML2. In the second area SA, the second power line PL2 may be formed to include only the first metal layer ML1. In the first area FA, a first insulating layer INS1 and a second insulating layer INS2 may be between the first metal layer ML1 and the second metal layer ML2 of the second power line PL2. In the first area FA, the first metal layer ML1 and the second metal layer ML2 may be electrically connected with each other through a contact hole H passing through the first and second insulating layers INS1 and INS2.

The first insulating layer INS1 may be an inorganic insulating material including an inorganic material. The inorganic material may include, for example, a silicon nitride, a silicon oxide, a silicon oxynitride, and the like.

The second insulating layer INS2 may be an organic insulating material including an organic material capable of relieving a curve of the first insulating layer INS1 and flattening a surface of the first insulating layer INS1. The organic material may include, for example, a polyacryl-based compound, a polyimide-based compound, a fluoro-based carbon compound (e.g., Teflon), a benzocyclobutene compound, or the like.

In the second area SA, the first insulating layer INS1 and the second insulating layer INS2 may be sequentially provided on the first metal layer ML1 of the second power line PL2. In one embodiment, the first insulating layer INS1 may be omitted. In this case, in the first area FA, the first metal layer ML1 may be under the second insulating layer INS2 and the second metal layer ML2 may be on the second insulating layer INS2. Further, the first and second metal layers ML1 and ML2 may be electrically connected through a contact hole in the second insulating layer INS2.

Referring to FIGS. 7 and 11, a display device may include a second power line PL2 and a connection line CL in a peripheral area PPA of a substrate SUB. The connection line CL may include odd-numbered connection lines CL1 and CL3 and even-numbered connection lines CL2 and CL4, which are alternately disposed on the substrate SUB. The connection line CL may extend in an inclined direction with respect to the second power line PL2 when viewed on a plane.

The even-numbered connection lines CL2 and CL4 include a second connection line CL2 and a fourth connection line CL4, and the odd-numbered connection lines CL1 and CL3 include a first connection line CL1 and a third connection line CL3.

The second and fourth connection lines CL2 and CL4 may be on a first gate insulating layer GI1 on the substrate SUB. A second gate insulating layer GI2 covering the second and fourth connection lines CL2 and CL4 may be on the second and fourth connection lines CL2 and CL4.

The first and third connection lines CL1 and CL3 may be on the second gate insulating layer GI2. In this case, the first and third connection lines CL1 and CL3 may be disposed on the second gate insulating layer GL2 so as not to overlap the second and fourth connection lines CL2 and CL4. An interlayer insulating layer IL covering the first and third connection lines CL1 and CL3 may be disposed on the first and third connection lines CL1 and CL3. For example, the first and third connection lines CL1 and CL3 and the second and fourth connection lines CL2 and CL4 may be formed on different layers, and may be formed of different materials by different processes.

The second power line PL2 may include a first area FA and a second area SA. The first area FA may be an area which does not overlap the connection line CL, and the second area SA may be an area which overlaps the connection line CL.

In the first area FA, the second power line PL2 may be formed in dual layers including a first metal layer ML1 and a second metal layer ML2. A first insulating layer INS1 and a second insulating layer INS2 may be between the first metal layer ML1 and the second metal layer ML2. The first insulating layer INS1 may be an inorganic insulating material including an inorganic material. The second insulating layer INS2 may be an organic insulating material including an organic material capable of relieving a curve of the first insulating layer INS1 and flattening a surface of the first insulating layer INS1. The organic material may include, for example, a polyacryl-based compound, a polyimide-based compound, a fluoro-based carbon compound, such as Teflon, a benzocyclobutene compound, and the like.

In the first area FA, the first metal layer ML1 and the second metal layer ML2 may be electrically connected with each other through a contact hole H passing through the first and second insulating layers INS1 and INS2. In the second area SA, the first insulating layer INS1 and the second insulating layer INS2 may be sequentially disposed on the first metal layer ML1 of the second power line PL2. In the present exemplary embodiment, the first and second metal layers ML1 and ML2 are electrically connected only in the first area FA of the second power line PL2 which does not overlap the connection line CL. Thus, it is possible to reduce or minimize defects of the second power line PL2.

FIGS. 12 to 19 are cross-sectional views illustrating embodiments of peripheral areas of display device of FIG. 8 including second power lines having various forms. In FIGS. 12 to 19, only a second area of a second power line overlapping a connection line is illustrated for illustrative purposes.

Figure 12:
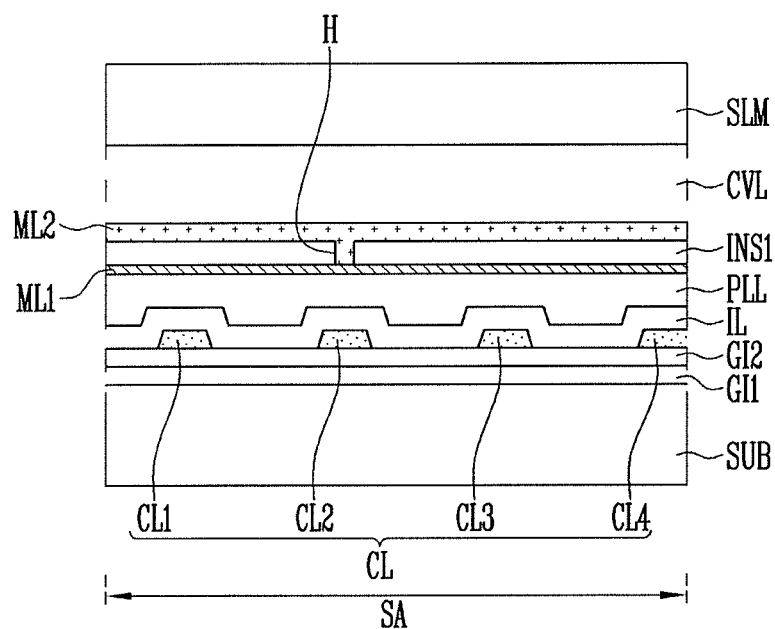
FIGS. 12 to 19 illustrate various embodiments of peripheral areas of display devices which include second power lines.

First, referring to FIGS. 8 and 12, at least part of a display device may have flexibility, e.g., the display device may be folded in a portion having the flexibility. For example, the display device may include a bending area having flexibility and which folds in one direction and a flat area at at least one side of the bending area that is not folded. The flat area may or may not have flexibility. The bending area may be provided in a peripheral area PPA of a substrate SUB.

The display device may include the substrate SUB, a connection line CL disposed on the substrate SUB, and first and second metal layers ML1 and ML2 disposed on the connection line CL. The first and second metal layers ML1 and ML2 may form a second area SA of a second power line PL2 (e.g., see FIG. 7).

The substrate SUB may include an insulating material such as glass, organic polymer, and crystal. Further, the substrate SUB may be formed of a material having flexibility that bends or folds and may have a single-layer structure of a multilayer structure.

First and second gate insulating layers GI1 and GI2 may be sequentially disposed on the substrate SUB. The first and second gate insulating layers GI1 and GI2 may be any one of an inorganic insulating material and an organic insulating material. In the present exemplary embodiment, the first and second gate insulating layers GI1 and GI2 may be inorganic insulating materials.

The connection line CL including first to fourth connection lines CL1, CL2, CL3, and CL4 disposed on the second gate insulating layer GI2.

An interlayer insulating layer IL may be on the connection line CL and may be an inorganic insulating material or an organic insulating material. In one exemplary embodiment, the interlayer insulating layer IL may be an inorganic insulating material. The interlayer insulating layer IL may have a curve form including a step portion generated by the connection line CL.

An opening may be in the insulating layers formed of the inorganic insulating material among the insulating layers provided in the bending area. The bending area is a curve area of the substrate SUB. The first and second gate insulating layers GI1 and GI2 and the interlayer insulating layer IL may have an opening formed by removing a portion corresponding to the bending area.

A planarizing layer PLL may be disposed on the interlayer insulating layer IL, may relieve a curve of the interlayer insulating layer IL, and may planarize a surface of the interlayer insulating layer IL. Thus, first metal layer ML disposed on the planarizing layer PLL may not be influenced by the curve form of the interlayer insulating layer IL. The planarizing layer PLL may be an organic insulating layer including an organic material having flatness having a degree, with which a surface of the interlayer insulating layer IL may be planarized. The organic material may include, for example, a polyacryl-based compound, a polyimide-based compound, a fluoro-based carbon compound, such as Teflon, or a benzocyclobutene compound. The planarizing layer PLL may have a predetermined thickness, e.g., about 3,000 Å or more. The planarizing layer PLL may be in the bending area and may be filled in at least a part of the opening or may be completely filled in the opening.

The first metal layer ML1 may be on the planarizing layer PLL and may have a flat form by the planarizing layer PLL.

A first insulating layer INS1 may be on the first metal layer ML1 and may include one or more contact holes H. The first insulating layer INS1 may have a flat form by the planarizing layer PLL.

The second metal layer ML2 may be on the first insulating layer INS1 and may be electrically connected with the first metal layer ML1 through the contact hole H of the first insulating layer INS1.

A cover layer CVL covering the second metal layer ML2 may be disposed on the second metal layer ML2. A sealing layer SLM may be on the cover layer CVL.

In the present exemplary embodiment, the planarizing layer PLL is under the first metal layer ML1, so that the first metal layer ML1, the first insulating layer INS1, and the second metal layer ML2 may not be influenced by the step portion generated by the connection line CL and have flat forms. Accordingly, when the contact hole H of the first insulating layer INS1 is in the second area SA of the second power line, the first and second metal layers ML1 and ML2 are not influenced by the step portion, thereby minimizing a defect of the second power line PL2.

Figure 13:
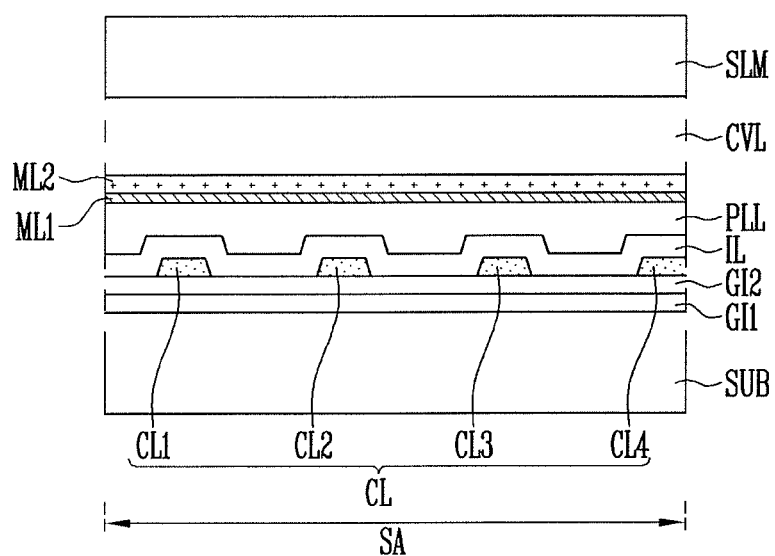

Referring to FIGS. 8 and 13, a display device may include a substrate SUB, a connection line CL on the substrate SUB, and first and second metal layers ML1 and ML2 on the connection line CL. The first and second metal layers ML1 and ML2 may form a second area SA of a second power line PL2 (e.g., see FIG. 7).

First and second gate insulating layers GI1 and GI2 may be sequentially disposed on the substrate SUB. The connection line CL may be disposed on the second gate insulating layer GI2. An interlayer insulating layer IL may be disposed on the connection line CL and may have a curve form including a step portion generated by the connection line CL.

A planarizing layer PLL may be on the interlayer insulating layer IL, and may relieve a curve of the interlayer insulating layer IL and planarize a surface of the interlayer insulating layer IL. Thus, a first metal layer ML on the planarizing layer PLL is not influenced by the curve form of the interlayer insulating layer IL.

The first metal layer ML1 may be on the planarizing layer PLL and may have a flat form by the planarizing layer PLL.

A second metal layer ML2 covers the first metal layer ML1, is directly connected to the first metal layer ML1, and may be on the first metal layer ML1.

A cover layer CVL covering the second metal layer ML2 may be on the second metal layer ML2. A sealing layer SLM may be on the cover layer CVL.

In the present exemplary embodiment, the planarizing layer PLL is under the first metal layer ML1, so that the first metal layer ML1 and the second metal layer ML2 may not be influenced by the step portion generated by the connection line CL and have flat forms.

Figure 14:
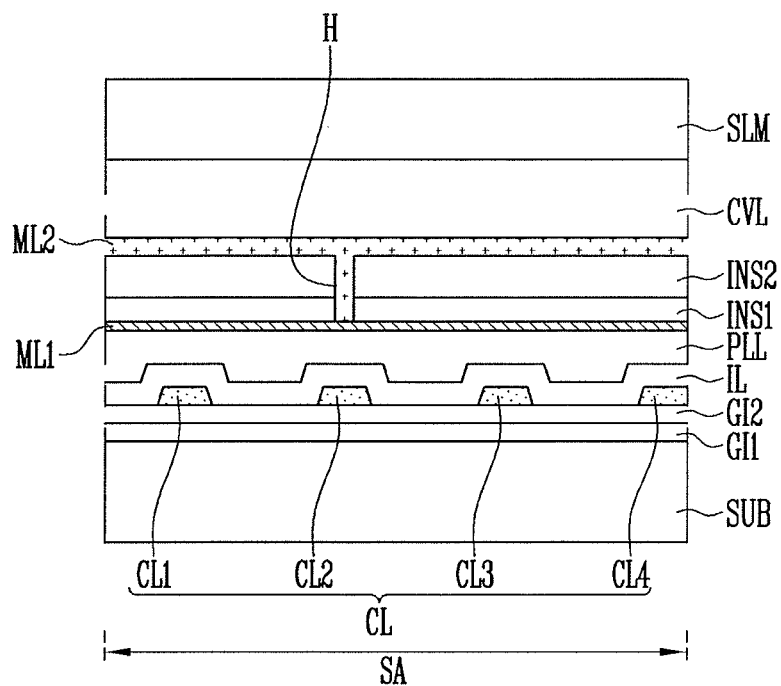

Referring to FIGS. 8 and 14, a display device may include a substrate SUB, a connection line CL on the substrate SUB, and first and second metal layers ML1 and ML2 on the connection line CL. The first and second metal layers ML1 and ML2 may form a second area SA of a second power line PL2 (e.g., see FIG. 7).

First and second gate insulating layers GI1 and GI2 may be sequentially disposed on the substrate SUB. The connection line CL may be on the second gate insulating layer GI2. An interlayer insulating layer IL may be on the connection line CL. The interlayer insulating layer IL may have a curve form including a step portion generated by the connection line CL.

A planarizing layer PLL may be on the interlayer insulating layer IL, and may relieve a curve of the interlayer insulating layer IL and planarize a surface of the interlayer insulating layer IL. Thus, a first metal layer ML on the planarizing layer PLL is not influenced by the curve form of the interlayer insulating layer IL.

The first metal layer ML1 may be on the planarizing layer PLL and may have a flat form by the planarizing layer PLL. A first insulating layer INS1 may be on the first metal layer ML1 and may have a flat form by the planarizing layer PLL. The first insulating layer INS1 may be an inorganic insulating material including an inorganic material, e.g., a silicon nitride, a silicon oxide, or a silicon oxynitride.

A second insulating layer INS2 may be on the first insulating layer INS1 and may be an organic insulating material including an organic material, which covers the first insulating layer INS1 and is capable of further planarizing a surface of the first insulating layer INS1.

A second metal layer ML2 may be on the second insulating layer INS2 and may be electrically connected with the first metal layer ML1 through a contact hole H passing through the first insulating layer INS1 and the second insulating layer INS2.

A cover layer CVL covering the second metal layer ML2 may be on the second metal layer ML2. A sealing layer SLM may be on the cover layer CVL.

In the present exemplary embodiment, the planarizing layer PLL is under the first metal layer ML1, so that the first metal layer ML1, the first insulating layer INS1, the second insulating layer INS2, and the second metal layer ML2 may not be influenced by the step portion generated by the connection line CL and have flat forms.

Figure 15:
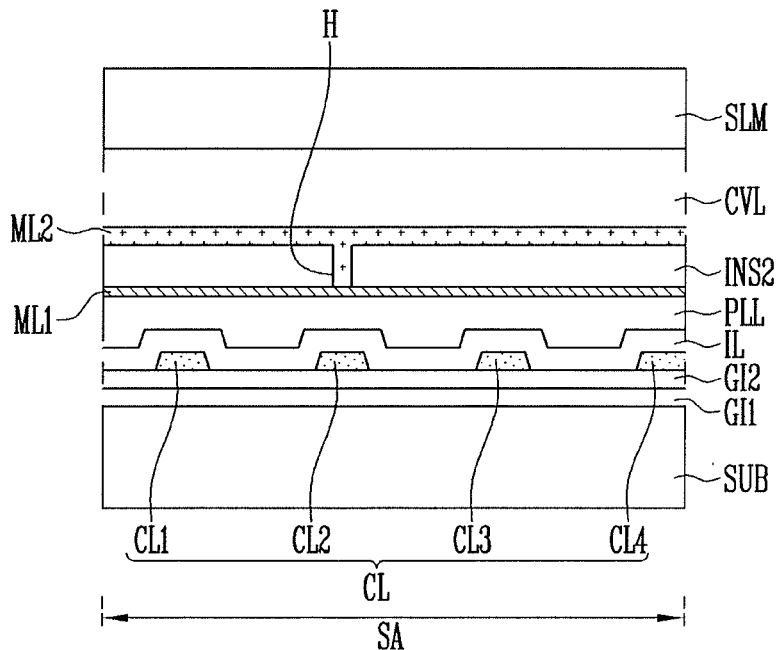

Referring to FIGS. 8 and 15, a display device may include a substrate SUB, a connection line CL on the substrate SUB, and first and second metal layers ML1 and ML2 disposed on the connection line CL. The first and second metal layers ML1 and ML2 may form a second area SA of a second power line PL2 (e.g., see FIG. 7).

First and second gate insulating layers GI1 and GI2 may be sequentially disposed on the substrate SUB. The connection line CL may be disposed on the second gate insulating layer GI2. An interlayer insulating layer IL may be disposed on the connection line CL. The interlayer insulating layer IL may have a curve form including a step portion generated by the connection line CL.

A planarizing layer PLL may be disposed on the interlayer insulating layer IL, and may relieve a curve of the interlayer insulating layer IL and planarize a surface of the interlayer insulating layer IL so that a first metal layer ML on the planarizing layer PLL is not influenced by the curve form of the interlayer insulating layer IL.

The first metal layer ML1 may be disposed on the planarizing layer PLL and may have a flat form by the planarizing layer PLL.

A second insulating layer INS2 may be disposed on the first metal layer ML1 and may be an organic insulating material including an organic material, which covers the first metal layer ML1 and is capable of further planarizing a surface of the first metal layer ML1. The second layer INS2 may include one or more contact holes H and may have a flat form by the planarizing layer PLL.

The second metal layer ML2 may be on the second insulating layer INS2 and may be electrically connected with the first metal layer ML1 through the contact hole H of the second insulating layer INS2.

A cover layer CVL covering the second metal layer ML2 may be on the second metal layer ML2. A sealing layer SLM may be on the cover layer CVL.

In the present exemplary embodiment, the planarizing layer PLL is under the first metal layer ML1, so that the first metal layer ML1, the second insulating layer INS2, and the second metal layer ML2 may not be influenced by the step portion generated by the connection line CL and have flat forms.

Figure 16:
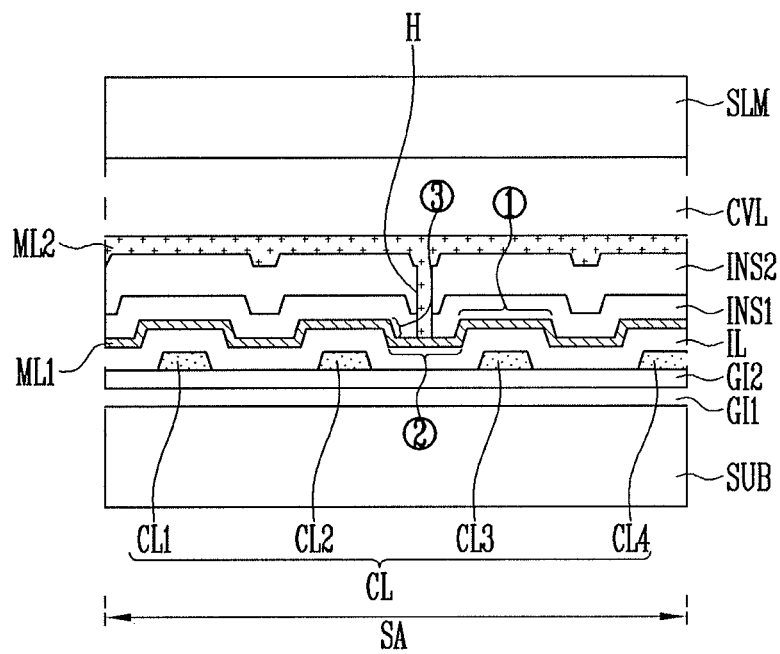

Referring to FIGS. 8 and 16, a display device may include a substrate SUB, a connection line CL on the substrate SUB, and first and second metal layers ML1 and ML2 disposed on the connection line CL. The first and second metal layers ML1 and ML2 may form a second area SA of a second power line PL2 (e.g., see FIG. 7) disposed in a peripheral area PPA (see FIG. 7) of the substrate SUB.

First and second gate insulating layers GI1 and GI2 may be sequentially disposed on the substrate SUB. The connection line CL may be disposed on the second gate insulating layer GI2. The interlayer insulating layer IL may be on the connection line CL. The interlayer insulating layer IL may have a curve form including a step portion generated by the connection line CL.

The first metal layer ML1 may be disposed on the interlayer insulating layer IL and may have a curve form by the interlayer insulating layer IL which has the curve form. The first metal layer ML1 may be divided into first to third portions ① to ③. The first portion ① of the first metal layer ML1 may be a portion corresponding to an upper surface of the connection line CL. The second portion ② of the first metal layer ML1 may be a portion corresponding to an area between two adjacent connection lines CL. The third portion ③ of the first metal layer ML1 may be a portion connecting the first and second portions ① and ②. The first portion ① of the first metal layer ML1 may be planarized by the upper surface of the connection line CL. The second portion ② of the first metal layer ML1 may be planarized by the interlayer insulating layer IL between the two adjacent connection lines CL.

A first insulating layer INS1 may be on the first metal layer ML1 and may have a curve form so as to correspond to the form of the first metal layer ML1. The first insulating layer INS1 may be an inorganic insulating material including an inorganic material, and may be omitted in one embodiment.

The first insulating layer INS1 may include one or more contact holes H provided within the first insulating layer INS1 and corresponding to the second portion ② of the first metal layer ML1.

A second insulating layer INS2 may be on the first insulating layer INS1 and may be an organic insulating material including an organic material, which covers the first insulating layer INS1 and is capable of planarizing a surface of the first insulating layer INS1. The second insulating layer INS2 may include one or more contact holes H corresponding to the contact hole H of the first insulating layer INS1.

The second metal layer ML2 may be on the second insulating layer INS2 and may be electrically connected with the first metal layer ML1 through the contact hole H of the first insulating layer INS1 and the contact hole H of second insulating layer INS2.

A cover layer CVL covering the second metal layer ML2 may be on the second metal layer ML2. A sealing layer SLM may be disposed on the cover layer CVL.

In the present exemplary embodiment, the contact holes H of the first and second insulating layers INS1 and INS2 are provided so as to correspond to the second portion ② of the first metal layer ML1. Thus, the electrical connection of the first and second metal layers ML1 and ML2 may not be influenced by the step portion generated by the connection line CL.

Figure 17:
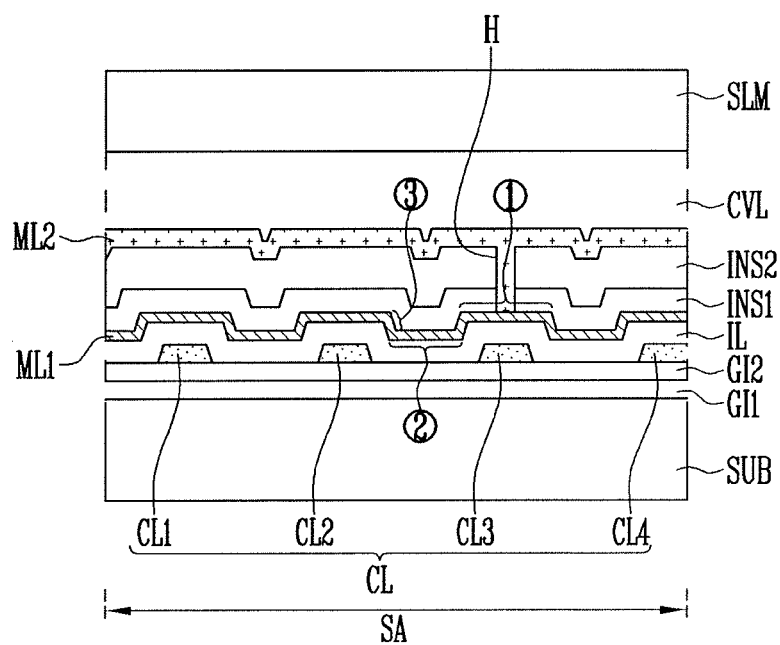

Referring to FIGS. 8 and 17, a display device according may include a substrate SUB, a connection line CL on the substrate SUB, and first and second metal layers ML1 and ML2 on the connection line CL. The first and second metal layers ML1 and ML2 may form a second area SA of a second power line PL2 (e.g., see FIG. 7) disposed in a peripheral area PPA (e.g., see FIG. 7) of the substrate SUB.

First and second gate insulating layers GI1 and GI2 may be sequentially disposed on the substrate SUB. The connection line CL may be disposed on the second gate insulating layer GI2. The interlayer insulating layer IL may be on the connection line CL. The interlayer insulating layer IL may have a curve form including a step portion generated by the connection line CL.

The first metal layer ML1 may be on the interlayer insulating layer IL and may have a curve form by the interlayer insulating layer IL which has the curve form. The first metal layer ML1 may be divided into first to third portions ① to ③. The first portion ① of the first metal layer ML1 may be a portion corresponding to an upper surface of the connection line CL. The second portion ② of the first metal layer ML1 may be a portion corresponding to an area between two adjacent connection lines CL. The third portion ③ of the first metal layer ML1 may be a portion connecting the first and second portions ① and ②. The first portion ① of the first metal layer ML1 may be planarized by the upper surface of the connection line CL. The second portion ② of the first metal layer ML1 may be planarized by the interlayer insulating layer IL between the two adjacent connection lines CL.

A first insulating layer INS1 may be disposed on the first metal layer ML1 and may have a curve form so as to correspond to the form of the first metal layer ML1. The first insulating layer INS1 may be an inorganic insulating material including an inorganic material, and may be omitted in one embodiment.

The first insulating layer INS1 may include one or more contact holes H provided within the first insulating layer INS1 so as to correspond to the first portion ① of the first metal layer ML1.

A second insulating layer INS2 may be disposed on the first insulating layer INS1 and may be an organic insulating material including an organic material, which covers the first insulating layer INS1 and is capable of planarizing a surface of the first insulating layer INS1. The second insulating layer INS2 may include one or more contact holes H corresponding to the contact hole H of the first insulating layer INS1.

The second metal layer ML2 may be disposed on the second insulating layer INS2 and may be electrically connected with the first metal layer ML1 through the contact hole H of the first insulating layer INS1 and the contact hole H of the second insulating layer INS2.

A cover layer CVL covering the second metal layer ML2 may be on the second metal layer ML2. A sealing layer SLM may be disposed on the cover layer CVL.

In the present exemplary embodiment, the contact holes H of the first and second insulating layers INS1 and INS2 are provided to correspond to the first portion ① of the first metal layer ML1 Thus, the electrical connection of the first and second metal layers ML1 and ML2 may not be influenced by the step portion generated by the connection line CL.

Figure 18:
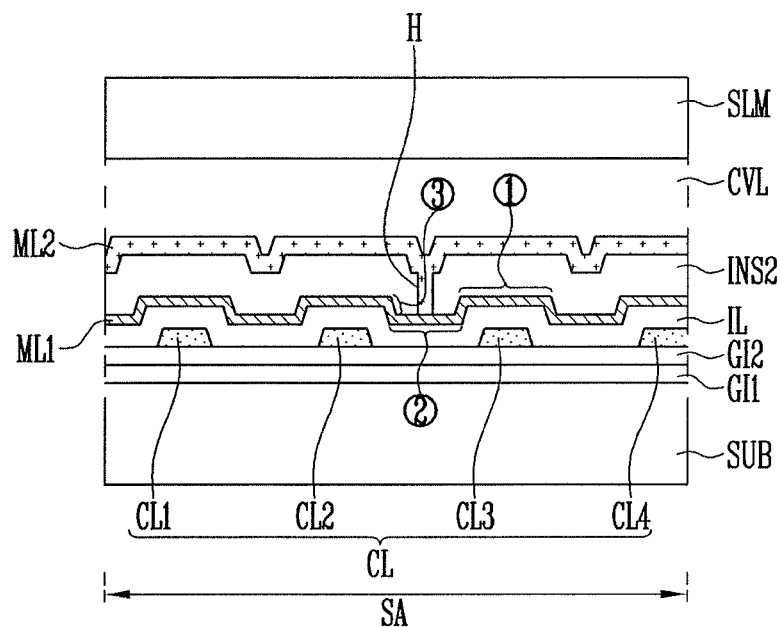

Referring to FIGS. 8 and 18, a display device may include a substrate SUB, a connection line CL disposed on the substrate SUB, and first and second metal layers ML1 and ML2 disposed on the connection line CL. The first and second metal layers ML1 and ML2 may form a second area SA of a second power line PL2 (e.g., see FIG. 7) disposed in a peripheral area PPA (e.g., see FIG. 7) of the substrate SUB.

First and second gate insulating layers GI1 and GI2 may be sequentially disposed on the substrate SUB. The connection line CL may be on the second gate insulating layer GI2. An interlayer insulating layer IL may be on the connection line CL. The interlayer insulating layer IL may have a curve form including a step portion generated by the connection line CL.

The first metal layer ML1 may be on the interlayer insulating layer IL and may include a first portion ① corresponding to an upper surface of the connection line CL, a second portion ② corresponding to an area between two adjacent connection lines CL, and a third portion ③ connecting the first and second portions ① and ②. The first portion ① of the first metal layer ML1 may be planarized by the upper surface of the connection line CL. The second portion ② of the first metal layer ML1 may be planarized by the interlayer insulating layer IL between the two adjacent connection lines CL.

A second insulating layer INS2 may be disposed on the first metal layer ML1. In the present exemplary embodiment, a first insulating layer INS1 (e.g., see FIG. 17) formed of an inorganic insulating material may be omitted between the first metal layer ML1 and the second insulating layer INS2. Accordingly, the second insulating layer INS2 may be directly disposed on the first metal layer ML1.

The second insulating layer INS2 may be an organic insulating material including an organic material, which covers the first metal layer ML1 and is capable of planarizing a surface of the first metal layer ML1. The second layer INS2 may include one or more contact holes H provided within the second insulating layer INS2 so as to correspond to the second portion ② of the first metal layer ML1.

The second metal layer ML2 may be on the second insulating layer INS2 and may be electrically connected with the first metal layer ML1 through the contact hole H of the second insulating layer INS2.

A cover layer CVL covering the second metal layer ML2 may be on the second metal layer ML2. A sealing layer SLM may be disposed on the cover layer CVL.

In the present exemplary embodiment, the contact hole H of the second insulating layer INS2 is provided to correspond to the second portion ② of the first metal layer ML1. Thus, electrical connection of the first and second metal layers ML1 and ML2 may not be influenced by the step portion generated by the connection line CL.

Figure 19:
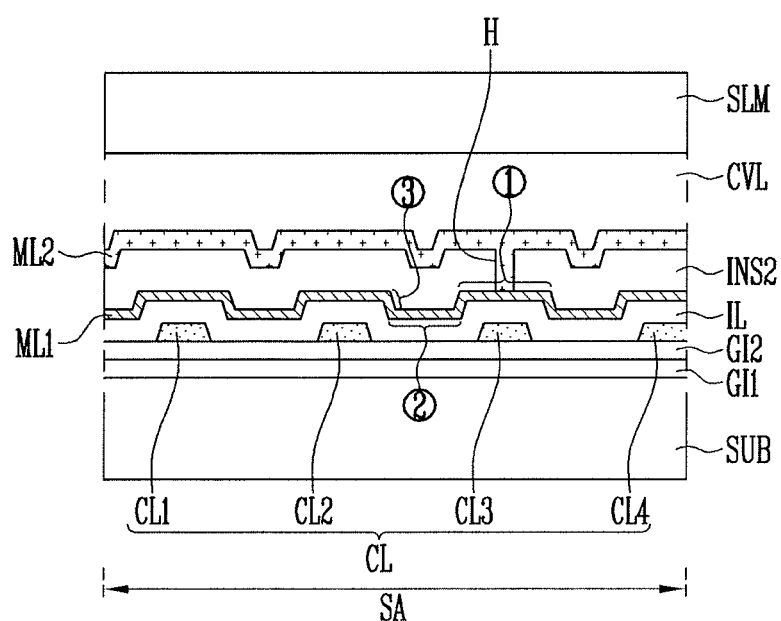

Referring to FIGS. 8 and 19, a display device may include a substrate SUB, a connection line CL on the substrate SUB, and first and second metal layers ML1 and ML2 on the connection line CL. The first and second metal layers ML1 and ML2 may form a second area SA of a second power line PL2 (e.g., see FIG. 7) disposed in a peripheral area PPA (e.g., see FIG. 7) of the substrate SUB.

First and second gate insulating layers GI1 and GI2 may be sequentially disposed on the substrate SUB. The connection line CL may be disposed on the second gate insulating layer GI2. An interlayer insulating layer IL may be on the connection line CL and may have a curve form including a step portion generated by connection line CL.

The first metal layer ML1 may be on the interlayer insulating layer IL and may include a first portion ① corresponding to an upper surface of the connection line CL, a second portion ② corresponding to an area between two adjacent connection lines CL, and a third portion ③ connecting the first and second portions ① and ②. The first portion ① of the first metal layer ML1 may be planarized by the upper surface of the connection line CL. The second portion ② of the first metal layer ML1 may be planarized by the interlayer insulating layer IL between the two adjacent connection lines CL.

A second insulating layer INS2 may be on the first metal layer ML1. In the present exemplary embodiment, a first insulating layer INS1 (e.g., see FIG. 17) formed of an inorganic insulating material may be omitted between the first metal layer ML1 and the second insulating layer INS2. Accordingly, the second insulating layer INS2 may be directly disposed on the first metal layer ML1.

The second insulating layer INS2 may be an organic insulating material including an organic material, which covers the first metal layer ML1 and is capable of planarizing a surface of the first metal layer ML1. The second layer INS2 may include one or more contact holes H provided within the second insulating layer INS2 so as to correspond to the first portion ① of the first metal layer ML1.

The second metal layer ML2 may be disposed on the second insulating layer INS2. The second metal layer ML2 may be electrically connected with the first metal layer ML1 through the contact hole H of the second insulating layer INS2.

A cover layer CVL covering the second metal layer ML2 may be on the second metal layer ML2. A sealing layer SLM may be disposed on the cover layer CVL.

In the present exemplary embodiment, the contact hole H of the second insulating layer INS2 is provided to correspond to the first portion ① of the first metal layer ML1. Thus, electrical connection of the first and second metal layers ML1 and ML2 may not be influenced by the step portion generated by the connection line CL.

The display device according to the aforementioned exemplary embodiments may be applied to various electronic devices, including but not limited to a television, a notebook computer, a mobile phone, a smart phone, a smart pad (PD), a Portable Multimedia Player (PDP), a Personal Digital Assistant (PDA), a navigation device, various wearable devices, such as a smart watch, and the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A display device, comprising:
a substrate including a pixel area including a plurality of pixels and a peripheral area adjacent to at least one side of the pixel area;
a power line, in the peripheral area, to provide a driving voltage to the pixels, the power line including a first metal layer and a second metal layer on the first metal layer;
a plurality of connection lines on the substrate, extending to the peripheral area from the pixels, spaced apart from one another by a predetermined interval, and disposed such that the connection lines are directly under the power line at a first location in the peripheral area;
a planarizing layer between the connection lines and the power line and covering steps of the connection lines; and
a first insulating layer on the planarizing layer and including at least one contact hole, wherein the first metal layer and the second metal layer of the power line are electrically connected through the contact hole.

2. The display device as claimed in claim 1, wherein the contact hole of the first insulating layer is provided to correspond to an area between the connection lines.

3. The display device as claimed in claim 1, wherein the contact hole of the first insulating layer is provided to correspond to upper surfaces of some connection lines among the connection lines.

4. The display device as claimed in claim 1, wherein the planarizing layer is an organic insulating material including an organic material.

5. The display device as claimed in claim 1, wherein the first insulating layer includes an inorganic insulating material or an organic insulating material.

6. The display device as claimed in claim 5, further comprising:
a second insulating layer on the first insulating layer.

7. The display device as claimed in claim 6, wherein:
the first insulating layer is an inorganic insulating material including an inorganic material, and
the second insulating layer is an organic insulating material including an organic material.

8. The display device as claimed in claim 7, wherein the second insulating layer includes one or more contact holes corresponding to the contact hole of the first insulating layer.

9. The display device as claimed in claim 8, wherein the first metal layer and the second metal layer of the power line are connected through the contact hole of the first insulating layer and the contact hole of the second insulating layer.

10. The display device as claimed in claim 1, wherein the first metal layer of the power line directly contacts the second metal layer of the power line above the plurality of connection lines.

11. The display device as claimed in claim 1, wherein the plurality of connection lines and the power line do not extend parallel with one another at the first location in the peripheral area.

12. The display device as claimed in claim 1, wherein the first metal layer is on the plurality of connection lines.

13. The display device as claimed in claim 1, wherein the first metal layer and the second metal layer extend in a parallel direction at the first location.

* * * * *